United States Patent
Nguyen

(10) Patent No.: US 10,962,353 B1
(45) Date of Patent: Mar. 30, 2021

(54) FIBER-OPTIC SENSORS IN A ROSETTE OR ROSETTE-LIKE PATTERN FOR STRUCTURE MONITORING

(71) Applicant: iSenseCloud, Inc., San Jose, CA (US)

(72) Inventor: An-Dien Nguyen, Fremont, CA (US)

(73) Assignee: iSenseCloud, Inc., San Jose, CA (US)

( * ) Notice: Subject to any disclaimer, the term of this patent is extended or adjusted under 35 U.S.C. 154(b) by 0 days.

(21) Appl. No.: 16/676,315

(22) Filed: Nov. 6, 2019

Related U.S. Application Data

(60) Division of application No. 16/223,652, filed on Dec. 18, 2018, now Pat. No. 10,514,251, which is a
(Continued)

(51) Int. Cl.
*G01B 11/16* (2006.01)

(52) U.S. Cl.
CPC .................. *G01B 11/165* (2013.01)

(58) Field of Classification Search
CPC ............ G02B 27/0093; G02B 27/0172; G02B 2027/014; G02B 2027/0178; G02B 27/0176; G02B 17/0678; G02B 5/22; G02B 6/2938; G02B 6/29395; G02B 17/0832; G02B 17/0848; G02B 1/005; G02B 2027/0127; G02B 2027/0138; G02B 2027/0159; G02B 2027/0185; G02B 2027/0187; G02B 21/0028; G02B 21/0032; G02B 21/0056; G02B 21/0064; G02B 21/008; G02B 26/06; G02B 26/103; G02B 27/0179; G02B 27/141; G02B 27/145; G02B 27/30; G02B 30/26; G02B 5/005; G02B 5/04; G02B 5/1842; G02B 5/204; G02B 5/208; G02B 5/32; G02B 6/02076; G02B 6/0208; G02B 6/262; G02B 6/29398; G02B 6/32; G02B 6/4204; G01B 11/002; G01B 11/005; G01B 11/14; G01B 11/026; G01B 11/16; G01B 11/272; G01B 2290/70; G01B 5/0004; G01B 5/008; G01B 7/30; G01B 9/02038; G01B 9/02068; G01B 9/02075; G01J 2003/1208; G01J 2003/1213; G01J 2003/1282; G01J 2003/2806; G01J 3/0208; G01J 3/021; G01J 3/0218; G01J 3/0229; G01J 3/1809; G01J 3/2803; G01J 3/2823; G01J 3/36; G01J 3/453
See application file for complete search history.

(56) References Cited

U.S. PATENT DOCUMENTS 5,493,390 A * 2/1996 Varasi ................ G01D 5/35383
250/227.18
7,336,862 B1 * 2/2008 Xai .................... G01D 5/35303
385/12
(Continued)

*Primary Examiner* — Michael P Stafira
(74) *Attorney, Agent, or Firm* — W. Eric Webostad

(57) ABSTRACT

An apparatus, and related method, relates generally to a fiber-optic sensing system. In such a system, fiber-optic sensors are in a rosette or rosette-like pattern. An optical circulator is coupled to receive a light signal from a broadband light source, to provide the light signal to the fiber-optic sensors, and to receive a returned optical signal from the fiber-optic sensors. A spectral engine is coupled to the optical circulator to receive the returned optical signal and configured to provide an output signal.

8 Claims, 14 Drawing Sheets

Related U.S. Application Data division of application No. 15/458,311, filed on Mar. 14, 2017, now Pat. No. 10,209,060, which is a continuation-in-part of application No. 14/814,355, filed on Jul. 30, 2015, now Pat. No. 10,033,153.

(60) Provisional application No. 62/310,664, filed on Mar. 18, 2016, provisional application No. 62/062,429, filed on Oct. 10, 2014, provisional application No. 62/031,790, filed on Jul. 31, 2014.

(56) References Cited

U.S. PATENT DOCUMENTS

| | | | |
|---|---|---|---|
| 2011/0247427 A1* | 10/2011 | Froggatt | G01D 5/35306 73/800 |
| 2012/0143525 A1* | 6/2012 | Chen | G01M 5/0025 702/42 |

* cited by examiner

FIBER-OPTIC SENSORS IN A ROSETTE OR ROSETTE-LIKE PATTERN FOR STRUCTURE MONITORING

CROSS-REFERENCE TO RELATED APPLICATION(S)

This nonprovisional application is a divisional application of, and hereby claims priority to, pending U.S. patent application Ser. No. 16/223,652, filed Dec. 18, 2018, which is a divisional application of U.S. patent application Ser. No. 15/458,311, filed Mar. 14, 2017, which is a continuation-in-part of U.S. patent application Ser. No. 14/814,355, filed Jul. 30, 2015 (now U.S. Pat. No. 10,033,153), which claims benefit of priority to Provisional Patent Application Nos. 62/062,429, filed Oct. 10, 2014, and 62/031,790, filed Jul. 31, 2014. U.S. patent application Ser. No. 15/458,311, filed Mar. 14, 2017, further claims the benefit of priority to U.S. Provisional Patent Application No. 62/310,664, filed Mar. 18, 2016. The entirety of each and all of the aforementioned provisional and nonprovisional applications are hereby incorporated by reference herein for all purposes and to the extent same is consistent herewith.

FIELD OF THE INVENTION

The following description relates to structure monitoring. More particularly, the following description relates to structure monitoring using fiber-optic sensors in a rosette or rosette-like pattern.

INTRODUCTION

For real-time structural monitoring, conventional instrumentation may not have sufficient performance, deployment capabilities, and/or other limitations. These one or more limitations may be a barrier to addressing some monitoring applications. Along those lines, the "Internet of Things" or "IoT" has facilitated wide deployments of sensors for sensed inputs sent over the Internet and/or another network for monitoring, as well as responding to detected events found through such monitoring.

BRIEF SUMMARY

An apparatus relates generally to a fiber-optic sensing system. In such a system, fiber-optic sensors are in a rosette or rosette-like pattern. An optical circulator is coupled to receive a light signal from a broadband light source, to provide the light signal to the fiber-optic sensors, and to receive a returned optical signal from the fiber-optic sensors. A spectral engine is coupled to the optical circulator to receive the returned optical signal and configured to provide an output signal.

A method relates generally to sensing. In such a method, fiber-optic sensors are attached in a rosette or rosette-like pattern to a structure. A light signal is generated with a broadband light source. The light signal is received by an optical circulator. The light signal is provided from the optical circulator to the fiber-optic sensors. A returned optical signal from the fiber-optic sensors is received by the optical circulator. The returned optical signal is provided from the optical circulator to a spectral engine to provide an output signal.

A method relates generally to a multi-sensing system. In such a method, a fiber-optic strain sensing system having a broadband light source coupled to a controller is operated. A strain and a direction thereof of a damage induced anomaly in a structure is detected. A laser-based acoustic-emission sensing system is triggered responsive to the detecting of the damage induced anomaly by the fiber-optic strain sensing system. Wavelength tracking logistics are provided for monitoring the damage induced anomaly.

Other features will be recognized from consideration of the Detailed Description and Claims, which follow.

BRIEF DESCRIPTION OF THE DRAWINGS

Accompanying drawings show exemplary apparatus(es) and/or method(s). However, the accompanying drawings should not be taken to limit the scope of the claims, but are for explanation and understanding only.

FIG. 7-1 is a block diagram of a perspective view depicting an exemplary patch attached to a host structure.

FIG. 7-2 is a block diagram of a cross-sectional view along A-A of the patch of FIG. 7-1.

FIG. 9-1 is a block diagram depicting the exemplary AE and FOS system of FIG. 8 optionally coupled to a Composite Overwrapped Pressure Vessel ("COPV").

FIG. 9-2 is a block diagram depicting the exemplary AE and FOS system of FIG. 8 coupled to COPV.

FIG. 10-1 is a block diagram depicting an exemplary single-channel laser tracking-based fiber optic voltage conditioning ("FOVC") system.

FIG. 10-2 is a block diagram depicting an exemplary multichannel FOVC system.

DETAILED DESCRIPTION

Figure 1:
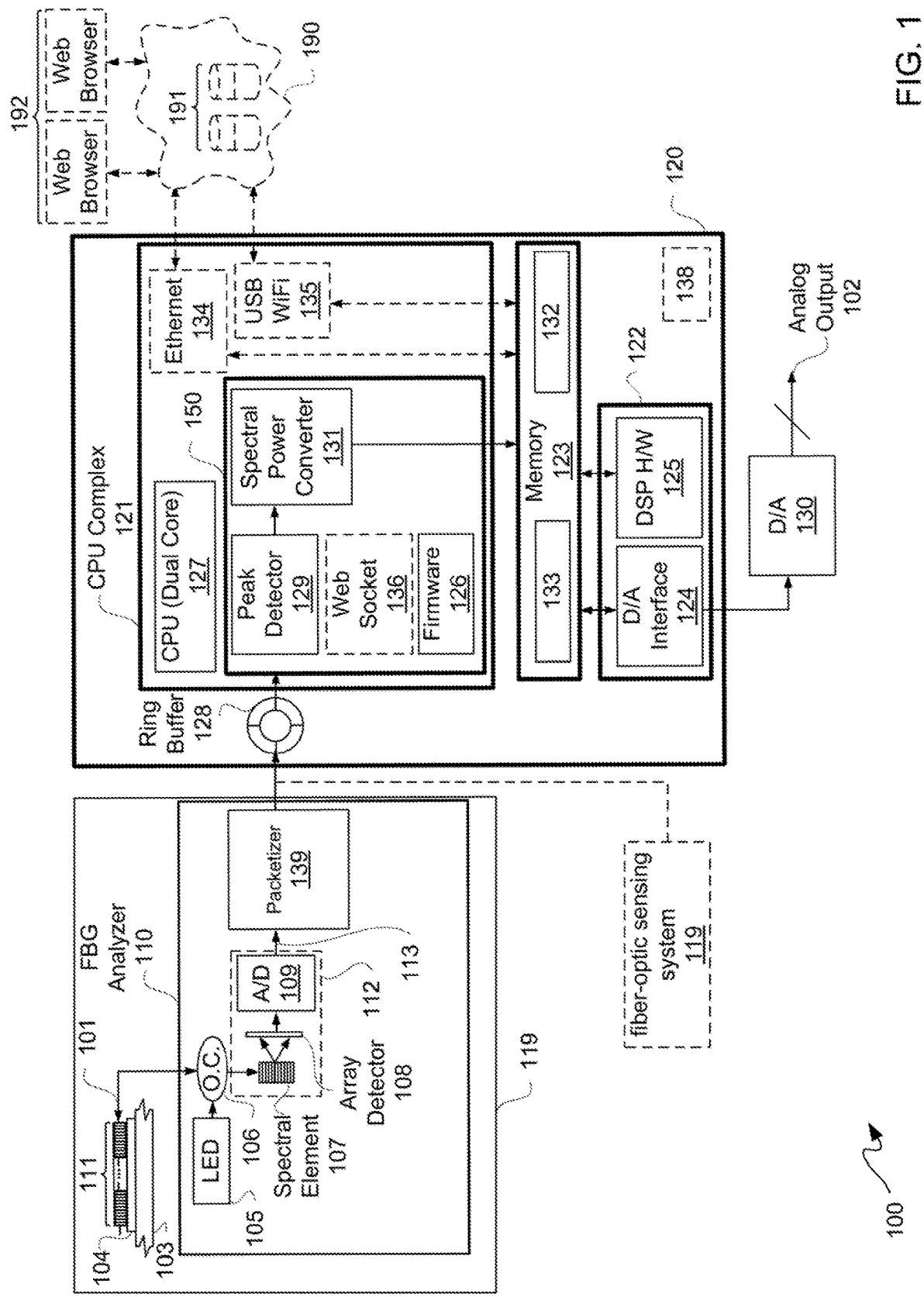
FIG. 1 is a block diagram depicting an exemplary fiber-optic strain ("FOS") system.

In the following description, numerous specific details are set forth to provide a more thorough description of the specific examples described herein. It should be apparent, however, to one skilled in the art, that one or more other examples and/or variations of these examples may be practiced without all the specific details given below. In other instances, well known features have not been described in detail so as not to obscure the description of the examples herein. For ease of illustration, the same number labels are used in different diagrams to refer to the same items; however, in alternative examples the items may be different.

Exemplary apparatus(es) and/or method(s) are described herein. It should be understood that the word "exemplary" is used herein to mean "serving as an example, instance, or illustration." Any example or feature described herein as "exemplary" is not necessarily to be construed as preferred or advantageous over other examples or features.

One or more aspects relate generally to a multifunctional photonic sensor for monitoring. More particularly, one or more aspects relate to an integrated photonics sensing system capable of simultaneously measuring strain/vibration ("strain") and detecting damage. Examples of types of detectable damage include cracking, corroding, and/or disbonding. Because such integrated photonics sensing systems are highly portable, such integrated photonics sensing systems may be located in generally inaccessible areas of structures and/or generally inaccessible structures. Moreover, structures that can be monitored include without limitation bolted, riveted and other types of fastened joints or interfaces between two or more elements of a structure.

Along those lines, multifunctional integrated sensors with interrogation systems may be used to lower cost and/or provide more effective structural health monitoring of long-duration structures, such as buildings, bridges, long-duration space ships and other space structures, as well as other structures. The miniaturized, lightweight, and compact integrated photonics sensors described herein may be used to locate damaged areas and/or detect probable failure zones with accurate assessment. An example of integrated photonics sensing system described herein is capable of simultaneously measuring different types of strain and detecting damage.

Sensor technology described herein may provide one or more advantages or features over conventional sensor technology. For example, sensor technology described herein may be compact, lightweight, and power efficient. In an example, a fiber-optic sensor technology described herein may have: a volume footprint of approximately 0.5 mm×2 mm×5 mm or less; a weight of approximately a few grams; and a power consumption of approximately a few Watts. Furthermore, such sensor technology described herein may be more sensitive to detection of damage and/or strain than conventional sensor technology.

An aspect of this sensor technology is a fiber-optic sensor in a rosette or rosette-like pattern. Along those lines, an acousto-ultrasonic fiber-based sensor, such as for example a Fiber Bragg grating ("FGB") sensor, can be interrogated by a compact, wireless, battery powered fiber-optic interrogator for strain and/or damage. Moreover, such FBG sensors may be coupled for detection static and dynamic fields such as temperature, strain, pressure, and acoustic waves, namely acoustic emission ("AE").

FBG sensors are wavelength-encoded, namely a Bragg wavelength, which makes FBG sensors self-referencing. Along those lines, FBG sensors may be independent of fluctuating light levels and other optical noise sources. This wavelength-encoding property is also convenient for multiplexing. Along those lines, multiple FBG sensors may be used to provide a distributed network for sensing.

Described below in additional detail is a capability of a rosette or rosette-like array pattern ("fiber-optic rosette") of fiber-optic sensors which may be used to measure strain and/or detect damage. A fiber-optic rosette may be field deployed with a multichannel wireless interrogator ("interrogator node") to allow data to be remotely recorded, analyzed, and displayed for visualization and large scale damage prognostics. Along those lines, a fiber-optic rosette may be used with Cloud storage and/or Cloud computing for storage and/or analysis ("Cloud storage/computing") of such data obtained.

A fiber-optic rosette may optionally be coupled with continuous monitoring using an AE sensing system. This coupling of a fiber-optic rosette with an AE sensing system provides ability to identify a failure's driving mechanism by correlating different types of defect data associated with process variables, such as load, strain, temperature, and/or pressure. Such AE sensing may be used for detecting signals of micro and macro cracking and/or leaking.

FBG sensors are suitable for measuring static and dynamic fields such as temperature, strain, pressure, and acoustic waves. FBG interrogation as described herein permits detection of a sub-microstrain resolution while simultaneously monitoring dynamic response, such as dynamic loads and stress waves, with high sensitivity and reproducibility.

When a damage site initiates or grows in a structure or material, a stress field changes around such damage site which leads to generation of elastic stress waves. These elastic stress waves may travel through such a structure or material to one or more AE sensors. Such AE sensors may be mounted on such structure or material to convert elastic stress waves of a disturbance, such as due to a damage site, into electrical signals. By analyzing such electrical signals, such as for a signal time or arrival time for example, AE may be used for monitoring civil infrastructure, pressure vessels, holding tanks, and/or other structures to detect crack formation and growth, corrosion, and/or leaks, as applicable. Such AE sensors may be FBG sensors as described herein in a fiber-optic rosette.

FBG sensors are suitable for measuring static and dynamic fields, such as temperature, strain, pressure, and/or acoustic waves. Sensed information from FBG sensors is wavelength-encoded. Along those lines, FBG sensors are self-referencing, rendering FBG sensors generally independent of fluctuating light levels and other optical noise sources. This wavelength-encoding property of FBG sensors offers convenient multiplexing, such as time division multiplexing ("TDM") or wavelength division multiplexing ("WDM"), along a single optical fiber for making highly localized strain, temperature, and/or stress wave measurements for condition-based monitoring over a distributed area. For structural health monitoring ("SHM"), FBG sensors can be used for both strain-based load monitoring and AE-based damage detection.

As described below in additional detail, a fiber-optic rosette may be used for strain-based load monitoring. FBG sensors of such fiber-optic rosette may perform "double-duty" by also being used as AE sensors. These fiber-optic rosette sensors may be used with a miniaturized interrogation device, including a stand-alone compact multichannel fiber-optic strain/AE interrogator with wireless data acquisition capability for strain and damage monitoring.

In an example, a fiber-optic rosette and interrogator ("fiber-optic rosette system") is a few grams in weight, displaces a 0.2 mm×2 mm×1 cm volume, and allows for response times measured in milliseconds. Moreover, such a fiber-optic rosette may have sufficient immunity to electromagnetic interference ("EMI") while providing high sensitivity to strain and stress wave signals over a wide frequency range without significant resonant response. Such a fiber-optic rosette system can provide high rate data recording, such as approximately up to a 2 kilohertz ("kHz") sampling rate per channel at sub-microstrain resolution. Such a fiber-optic rosette system may be used for monitoring structures under static and dynamic loading conditions.

FIG. 1 is a block diagram depicting an exemplary fiber-optic strain system 100. Fiber-optic strain ("FOS") system 100 may be configured to convert optical signals from FBG fiber-optic sensors 111 in a rosette or rosette-like pattern into analog voltage outputs that may be directly interfaced with strain instrumentation. FOS system 100 may include a subsystem, namely fiber-optic system for sensing ("fiber-optic sensing system") 119.

Along those lines, an example FBG interrogation system may have broadband super-luminescent light-emitting diodes ("SLED"), an optical circulator, and a spectral engine 112, such as for example an InGaAs spectral engine. A commercially available spectral engine 112 may include a Volume Phase Grating ("VPG") for a spectral element 107 and a multi-element array detector 108, such as for example an InGaAs CCD (charge-coupled device) array detector. In such system, an optical signal reflected back from FBG fiber-optic sensors 111 may be spectrally dispersed with such a VPG, such that reflected power from each VPG may extend over only a few pixels of a CCD array detector. This reflected power extending to just a few pixels may represent a sufficient number of data points for a downstream digital signal processor or digital signal processing algorithms of a general-purpose processor to be applied to provide higher resolutions. Using a multi-element array detector facilitates high-speed parallel processing, real time spectrum inspection with sub-millisecond ("sub-ms") response times, and sub-pico meter ("sub-pm") spectral resolution.

Strain-induced wavelength shifts experienced by one or more of FBG fiber-optic sensors 111 may be converted to analog voltage signals ("analog output") 102 that resemble parametric outputs of a conventional strain gauge signal conditioner. This allows an FOS system 100 to work as a high-performance "drop-in" replacement for a signal conditioner in conventional strain measurement systems, as described below in additional detail.

FOS system 100 may include an FBG Analyzer ("FBGA") module 110, a System-on-Chip ("SoC") module 120, FBG fiber-optic sensors 111 in an optical fiber 101, an optical fiber-to-structure bonding material 104, and a digital-to-analog ("D/A") converter 130. Optionally, FOS system 100 may be coupled to a network 190, which may include the Internet or other network, for Cloud storage/computing 191. Optionally, one or more web-browser enabled devices 192 may be used to communicate with such Cloud storage/computing 191 via such network 190.

FBG fiber-optic sensors 111 in optical fiber 101 housing may be coupled to receive and provide an optical signal via such optical fiber 101, the former of which may be for optical transmission of light from a broadband light source 105. A bonding material 104 may be used to couple optical fiber 101 having FBG fiber-optic sensors 111, namely bonding FBG fiber-optic sensors 111 to a material or structure under test 103. A cyanoacrylate or other adhesive may be used for example for a bonding material 104. Optionally, rather than direct bonding to a material or structure under test 103, a polymer substrate may be used as described below in additional detail.

A broadband light source 105, such as an LED light source, including an SLED, of FBGA module 110 may provide light to an optical circulator 106 of FBGA module 110, and such light may be sent through to optical fiber 101 via passing through optical circulator 106 through to FBG fiber-optic sensors 111. Responsive to strain-induced wavelength shifts experienced by one or more of FBG fiber-optic sensors 111, reflected light from FBG fiber-optic sensors 111 may be provided as returned optical signals via optical fiber 101 to optical circulator 106 for spectral element 107 of FBGA module 110. As described below in additional detail, more than one optical fiber 101 may be coupled to provide a rosette or rosette-like pattern of FBG fiber-optic sensors 111, which may be coupled to a spectral element 107 through optical circulator 106.

Reflected light may be spectrally dispersed through spectral element 107, which in this example is one or more VPGs of a spectral engine 112 of FBGA module 110. Such dispersed light may be detected by a photodiode array 108 of FBGA module 110, which in this example is an InGaAs photodiode array; however, other types of photodiode arrays may be used in other implementations. As described above, a spectral engine 112 may include a CCD array detector 108. Along those lines, a CCD array detector 108 may include or perform the function of an analog-to-digital converter ("A/D") converter 109 as part of spectral engine 112. In another example, a separate A/D converter 109 may be used, as either an analog or digital array detector 108 may be used. For purposes of clarity and not limitation, it shall be assumed that a photodiode array 108 is used that does not incorporate an A/D converter 109.

Data output of photodiode array 108 may be digitized using an A/D converter 109 of FBGA module 110 to provide digital data output 113. Digital data output 113 of A/D converter 109 may be packetized by an on-board integrated circuit packetizer 139 of FBGA module 110, which in this example is separate from an FPGA of SoC module 120. However, in another implementation, packetizer 139 and/or A/D converter 109 may be implemented in an FPGA of SoC module 120. Such packetized information may be forwarded from packetizer 139 to SoC module 120 for post-processing. Packetizer 139 may be for hardwired Ethernet or other hardwired communication, or packetizer 139 may be for wireless communication, such as for WiFi, WLAN, or other wireless traffic. Moreover, even though a single channel system is illustratively depicted, a multi-channel system may be implemented as described below in additional detail.

SoC module 120 may include a CPU complex 121, a programmable gate array device 122, and main memory 123. In this example, such programmable gate array device 122 is an FPGA; however, in other implementations, other types of integrated circuits, whether programmable gate array devices or not, may be used to provide a digital-to-analog ("D/A") interface 124 and digital signal processing ("DSP") hardware 125.

CPU complex 121, which may be on a same FPGA as D/A interface 124 and DSP hardware 125 in another implementation, in this implementation includes a dual-core CPU 127 running firmware 126. However, a single core or other types of multi-core CPUs may be used in other implementations. Generally, a signal conversion block 150, which may be in CPU complex 121, may include a peak detector 129, a Web socket 136, firmware stored in memory ("firmware") 126, and a spectral power converter 131. Firmware 126 may receive data from packetizer 139 of FBGA 110 into a ring buffer 128 of SoC module 120, which may also be of CPU complex 121.

Ring buffer 128 may be used to store a continuous stream of samples from packetizer 139 of FBGA 110 to in effect allow FOS system 100 to plot outputs of FBG fiber-optic sensors 111 in a rosette or rosette-like pattern over a period of time. Firmware 126 may be configured to clean up data from ring buffer 128. Data from ring buffer 128 may be provided to a peak detector 129, and detected peaks may be provided from peak detector 129 to spectral power block 131 to quantify spectral power associated with each of such peaks detected. Along those lines, firmware 126 may quantify wavelength shifts, which are directly proportional to the amount of strain experienced and spectral power sensed by each of FBG fiber-optic sensor 111 in a rosette or rosette-like pattern. This post-processed data 132 may be stored in main memory 123.

In this implementation, programmable gate array 122, which is coupled to main memory 123, is configured to provide hardware that reads data 132 that firmware 126 has placed in main memory 123 and that performs signal processing tasks on such data 132 using DSP hardware 125. An example of a signal processing task may be an FFT and/or the like to measure any vibration components in data 132.

Output of DSP hardware 125, such as an FFT output for example, may be written back to main memory 123 as data 133 for use by CPU complex 121. D/A interface 124 of programmable gate array device 122 may be used to send FBG sensor data 132 to an external D/A converter 130 to mimic a parametric output of a conventional strain signal conditioner. FOS system 100 may work as a high-performance "drop-in" replacement for a signal conditioner in conventional strain measurement systems, and so analog output 102 may be provided to conventional strain measurement instrumentation (not shown). Each output of D/A converter 130 may represent an output of one FBG fiber-optic rosette sensor of FBG fiber-optic sensors 111.

CPU complex 121 via firmware 126 may be configured to read strain data 133 that programmable gate array 122 has placed in main memory 123. CPU complex 121 may optionally include either or both an Ethernet interface 134 or a USB WiFi interface 135 to forward strain data 133 to one or more remote computers connected over network 190. Optionally, an external Cloud server or servers for providing Cloud storage/computing 191 may take outputs from multiple FOS systems 100 and store them in a database for further analysis by software running on such Cloud server(s). In this example, such computers may include multiple HTML5-compliant Web browsers 192 to communicate with such Cloud servers and/or to communicate with one or more FOS systems 100 to access strain data 133, which may allow users to make business decisions and/or configure individual FOS systems 100 using corresponding optional Web sockets 136 of CPU complexes 121 of such systems. However, in another or this implementation data may be wirelessly transferred, using for example a TCP/IP protocol, to a remote or local notebook computer for data analysis.

For portability, SoC module 120 and one or more fiber-optic sensing systems 119 may be powered with a battery-based power supply ("battery") 138, which in this example may be a 5 volt battery power supply. Along those lines, because of an ability to multiplex data from FBG sensors, more than one fiber-optic sensing system 119 may optionally be coupled to a same SoC module 120. Such one or more fiber-optic sensing systems 119 may be coupled to a same ring buffer 128, such as using USB or other type of communication connection. However, for purposes of clarity and not limitation, only one-to-one relationship between fiber-optic sensing system 119 and SoC module 120 is described below.

Figure 2:
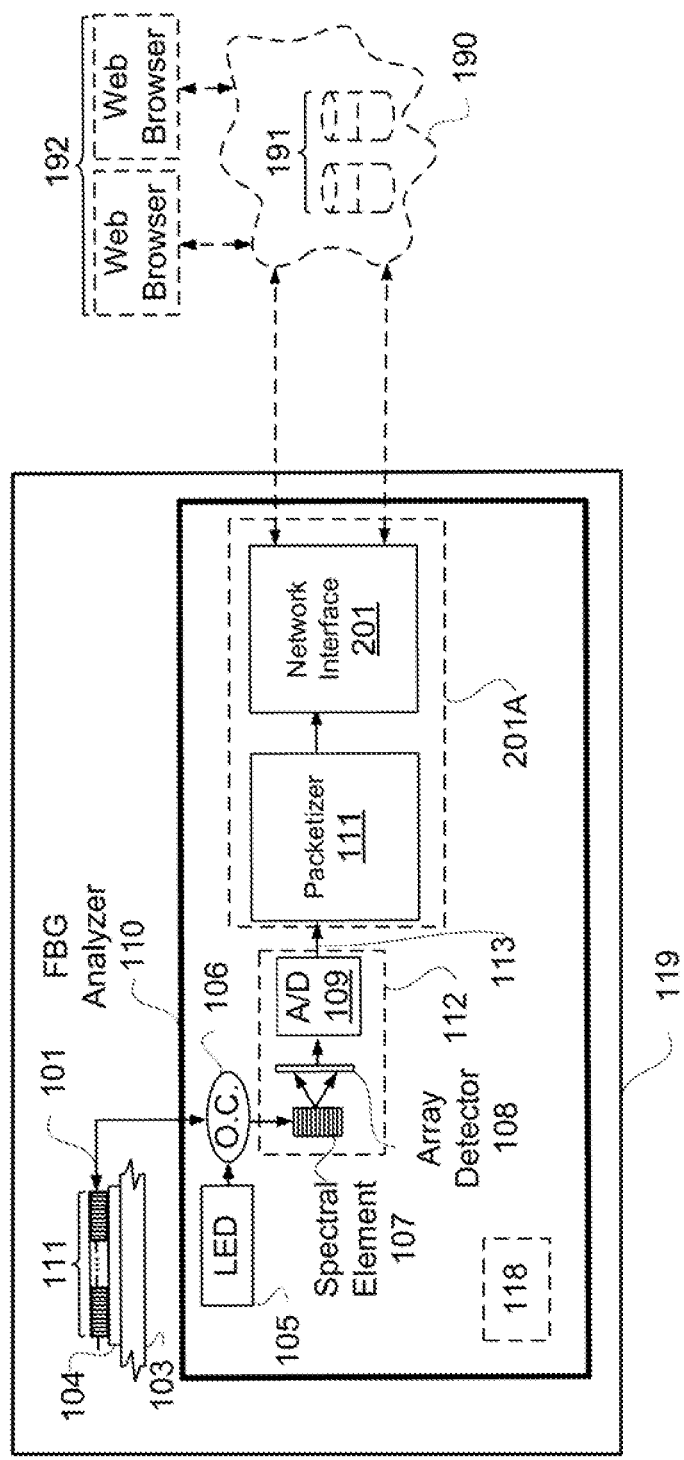
FIG. 2 is a block diagram depicting another exemplary FOS system.

FIG. 2 is a block diagram depicting an exemplary FOS system 200. FOS system 200 is the same as FOS system 100 of FIG. 1, except SoC module 120 is replaced with a network interface 201, and functions associated with SoC module 120 may be performed by Cloud storage/computing 191.

Fiber-optic sensing system 119 may optionally be a stand-alone system, such as without an interrogator node directly mechanically coupled thereto. Along those lines, a smaller battery power supply ("battery") 518 than battery 138 may be used to power fiber-optic sensing system 119.

Network interface 201 may be an Ethernet or other type of network interface configured for hardwired and/or wireless communication with a network 190. In this example, network interface 201 is for wirelessly communicating with network 190 for sending packetized data from packetizer 139 to network 190 for Cloud storage/computing 191. Along those lines, data sourced from FBG fiber-optic sensors 111 may be stored and processed remotely with respect to FBGA module 110. Processing operations, including associated processing functions, provided with SoC module 120 may be provided with Cloud storage/computing 191. Moreover, network interface 201 may be configured to include packetizer 139, namely network interface 201A. Network interface 201A may be incorporated into FBGA module 110 or may be separate therefrom.

To recapitulate, multifunctional integrated FBG fiber-optic sensors 111 may be coupled to an FBGA module 110, as part of an interrogation system. FBG fiber-optic rosettes as described herein can be interrogated by a compact, wireless, battery powered fiber-optic interrogator for both strain and AE detection, such as SoC module 120. Optionally or additionally, such interrogation system may be remotely provided using Cloud storage/computing 191. A fiber-optic rosette array may be field deployed with a multichannel wireless interrogator node to allow data to be remotely recorded, analyzed, and displayed for visualization and large scale damage prognostics. Along those lines, a fiber-optic rosette array, such as of FBG fiber-optic sensors 111, may be used with Cloud storage/computing 191 for storage and/or analysis of such data obtained.

In the former example implementation, FBG fiber-optic sensors 111 may be used with a miniaturized interrogation device, including a stand-alone compact multichannel fiber-optic strain/AE interrogator with wireless data acquisition capability for strain and damage monitoring. In the latter example implementation, FBG fiber-optic sensors 111 may be used with only an FBGA module 110 of such a miniaturized interrogation device with wired and/or wireless data acquisition capability for strain and damage monitoring.

The latter example implementation facilitates wide spread deployment of FBG fiber-optic sensors 111 coupled to an FBGA module 110. Such FBG fiber-optic sensors 111 and FBGA module 110 systems may be compact and low power. Such FBG fiber-optic sensors 111 and FBGA module 110 systems may be deployed with only battery-based power systems and wireless connectivity. Moreover, use of a broadband light source for collecting a signal for strain measurement may reduce cost, size and power consumption in comparison with a narrowband light source.

Figure 3:
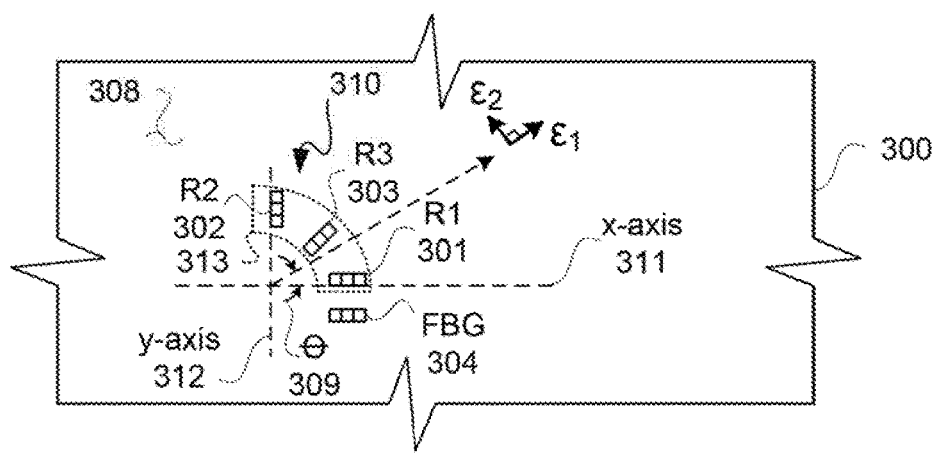
FIG. 3 is a block diagram depicting an exemplary rosette or rosette-like pattern for FBG fiber-optic sensors of FIGS. 1 and 2.

FIG. 3 is a block diagram depicting an exemplary rosette or rosette-like pattern 310 for FBG fiber-optic sensors 111 of FIGS. 1 and 2. FBG fiber-optic sensors 111 include FGB sensor R1 or 301, FBG sensor R2 or 302 and FBG sensor R3 or 303. Each FBG sensor 301 through 303 may include a fiber grating array of sensors or fiber grating sensor array. Optionally, FBG sensors 301 through 303 may be attached to an upper surface of substrate 313, such as a polymer substrate for example to provide a "patch." A lower surface of substrate 313 may be bonded, adhered, glued or otherwise attached to surface 308. For example, a patch substrate 313 may have a single FBG sensor or more than one FGB sensor in a rosette or rosette-like pattern 310 on one side and a peel-off backing for exposing an adhesive for attachment on an opposite side. Optionally, rather than surface mounting of FBG fiber-optic sensors 111 to an upper surface of substrate 313, FBG fiber-optic sensors 111 may be integrated into a substrate 313 structure.

Optionally, in or outside of plane strain pattern 310 may an FBG fiber-optic temperature sensor 304. For temperature compensation due to room temperature shift, a FBG temperature sensor 304 may be used to measure ambient temperature, and temperature values obtain using FBG temperature sensor 304 may be used to offset contribution from thermal strain due to room temperature change.

In order to determine the three independent components of plane strain, two normal strains $\varepsilon_x$ and $\varepsilon_y$ and shear strain $\varepsilon_{xy}$, namely three linearly independent strain gage measurements, may be used. Along those lines, FBG sensor 301 may be positioned aligned to an x-axis 311 to obtain an $\varepsilon_x$ measurement for horizontal normal strain in the x-direction, and FBG sensor 302 may be positioned aligned to a y-axis 312 to obtain an $\varepsilon_y$ measurement for vertical normal strain in the y-direction. FBG sensor 303 may be positioned at an angle between FBG sensors R1 and R2 to obtain an $\varepsilon_{xy}$ measurement for shear strain in the xy-direction.

FBG sensors R1 through R4 may be bonded or otherwise adhered to a surface 308 of a structure 300 to be monitored for strain, or more particularly plane strain for surface 308 generally a plane. Optionally, structure 300 may be monitored for temperature too, as previously described. For loading applied at an angle θ 309 with respect to x-axis 311 or FBG sensor R1 301, plane strain may be measured for structure 300.

In the presence of only a two-dimensional strain field, namely N=2, a strain response R may be expressed as a sum of each principal strain vector ε multiplied or dot product by a direction vector r of a strain gage. This strain response R relationship may be mathematically expressed as:

$$R = \sum_{i=1}^{2} \vec{\varepsilon} \cdot \vec{r}$$

From the strain response R mathematical relationship above, for a rectangular rosette, directionally normal strain ("normal strain") in any direction on a surface 308 may be related to two principal strains $\varepsilon_1$ and $\varepsilon_2$ with the latter normal or perpendicular to the former and an angle θ 309 of loading from a principal axis to a direction of strain, namely a direction of a principal strain $\varepsilon_1$. The relationship between such two principal normal strains from three measurements $R_1$ through $R_3$ of strain by FBG sensors R1 through R3 respectively may be mathematically expressed as:

$$\varepsilon_{1,2} = \frac{R_1 + R_2}{2} \pm \frac{1}{\sqrt{2}} \sqrt{(R_1 - R_3)^2 + (R_2 - R_3)^2}$$

for R1, R2, R3 respectively corresponding strain measurements from FBG sensors R1, R2 and R3. A loading angle θ, namely a direction of strain for a structure 300 under loading, may be mathematically related to R1, R2, R3 strain measurements associated therewith. This relationship between loading angle θ and R1, R2, R3 strain measurements may be mathematically expressed as:

$$\theta = \frac{1}{2} \tan^{-1}\left(\frac{R_1 + R_2 - 2R_3}{R_1 - R_2}\right)$$

Though an exemplary rosette or rosette-like pattern 310 for FBG fiber-optic sensors 111 was illustratively depicted with three FBG sensors 301 through 303, in another implementation any two of FBG sensors 301 through 303 may be used for a rosette or rosette-like pattern 310, which in this example is for a first quadrant partial rosette-like pattern 310. For example, either principal normal strain FBG sensor 301 or 302 along with a shear strain FBG sensor 303 may be used; or principal normal strain FBG sensors 301 and 302 may be used. However, a less reliable total strain measured may result in using only two of such FBG sensors.

Figure 4:
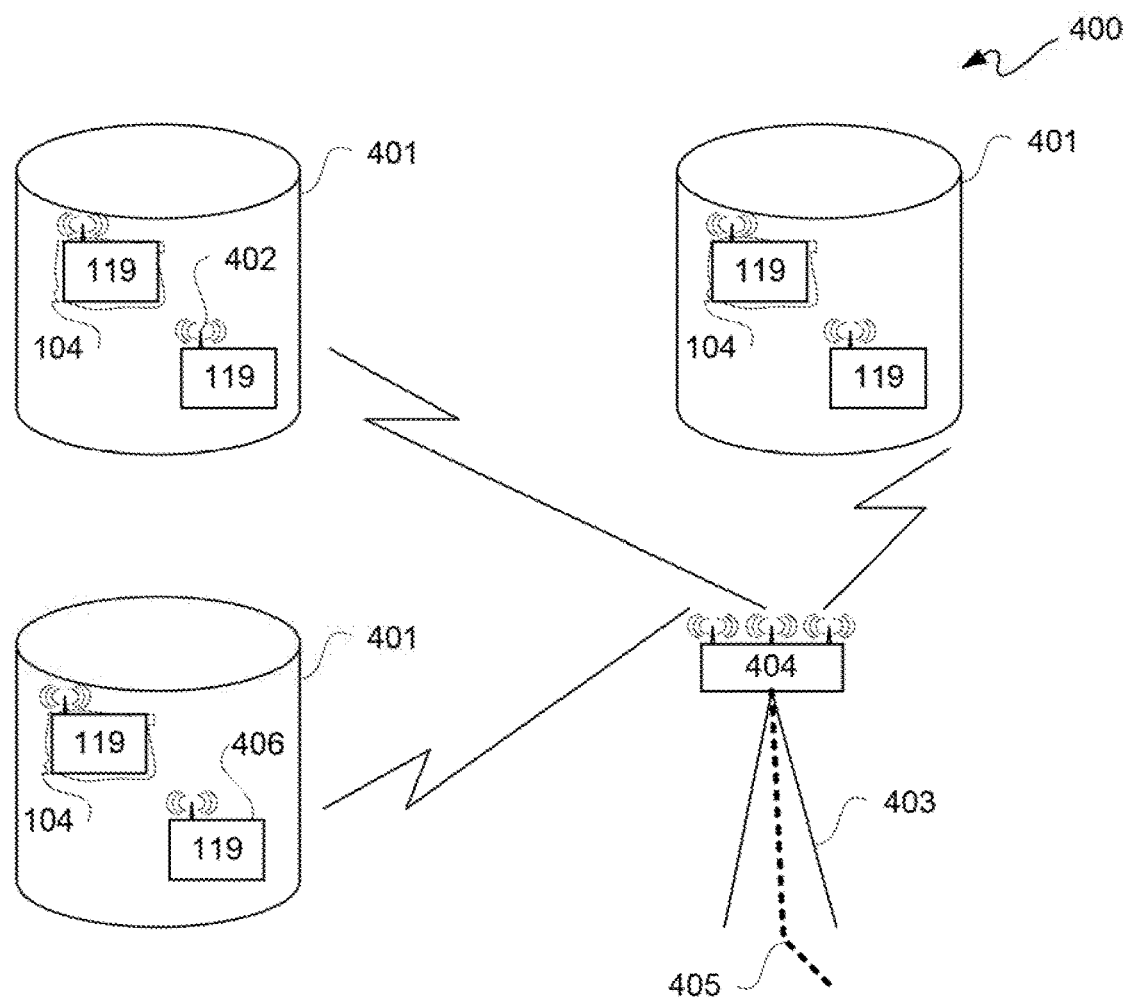
FIG. 4 is a block diagram depicting an exemplary wireless network.

FIG. 4 is a block diagram depicting an exemplary wireless network 400. Wireless network 400 is further described with simultaneous reference to FIGS. 1 through 4.

Wireless network 400 may include a plurality of fiber-optic sensing systems 119. Such fiber-optic sensing systems 119 may have FBG fiber-optic sensors 111 attached to structures, which in this example are oil storage tanks 401 with an adhesive or bonding material 104. However, other structures may be used. Moreover, fiber-optic sensing systems 119 may be attached using a magnet and/or an bonding material 104.

Antennas 402, such as may be part of a wireless network interfaces 201, may be used to communicate information sourced from FBG fiber-optic sensors 111 to a wireless router 404. Wireless router 404, which may include a modem for communication to the Internet or other network, may optionally be hardwired to an Ethernet or other communication cable 405, as a hardwired backhaul for communication information to Cloud storage/computing 191. Wireless router 404 may be separately powered with respect to fiber-optic sensing systems 119.

Along those lines, fiber-optic sensing systems 119 may be enclosed. A housing 406 may enclose fiber-optic sensing systems 119, as well as cover FBG fiber-optic sensors 111 attached to oil storage tanks 401. Because FBG fiber-optic sensors 111 do not provide an electrical sparking ignition source, a small battery 518 used to power fiber-optic sensing systems 119 and optical radiation from a broadband light source 105, namely possible sources of ignition, are both encased in a housing to reduce any possibility of electrical sparking ignition. Optionally, battery 518 may include a photovoltaic array coupled to charge/recharge battery 518 to extend time between maintenance of fiber-optic sensing systems 119.

Wireless router 404 may optionally be positioned on top of a tower 403, which tower 403 is separately located away from oil storage tanks 401. Having wireless router 404 positioned remotely from oil storage tanks 401 may be less prone to damage, theft, tampering, and source of electrical sparking ignition with respect to an oil storage tank 401.

Accordingly, fiber-optic sensing systems 119 may obtain strain data, as well as optionally temperature data, and wirelessly communicate such information to wireless router 404. Optionally, fiber-optic sensing systems 119 may be used for AE sensing, as described below in additional detail, and thus damage data obtained by AE sensing may likewise be wirelessly communicated to wireless router 404.

Wireless router 404 may be part of a base station 404 for cellular communication with or without a backhaul 405. Along those lines, network interface 201 may include a one-way cellular radio for communication to base station

404. In another implementation, network interface 201 may include a two-way cellular radio for communication to and from base state 404. Moreover, in a wireless local area network or WLAN implementation, network interface 201 may be configured for two-way communication with wireless router 404. In a two-way communication implementation, fiber-optic sensing systems 119 may be remotely checked and maintained for proper operation, in addition to having strain data communicated to Cloud storage/computing 191 for storage and processing.

In another implementation, wireless router 404 may be a wireless access point 404. Along those lines, hardwired communications cable 405 may be coupled to a router, hub or switch in a known manner.

In yet another implementation, fiber-optic sensing systems 119 may be Bluetooth devices configured for communicating with a Bluetooth access server 404. Moreover, a multi-radio access server and access point/router 404 may be used for a combination of Bluetooth and WiFi for example.

For example for dynamic strain monitoring of a portion of an oil storage tank 401, broadband light from a SLED may be directed to a FBG-based strain rosette. Reflected light may be dispersed by a dispersive medium and then such dispersed-reflected light may be detected by a CCD array. Such CCD array may digitize such detected dynamic strain data. In an implementation, this digitized dynamic strain data may be locally stored, such as by using a field-programmable-gate-array ("FPGA") and an SoC, such as for example a Zedboard SoC. In an implementation, such dynamic strain data may be wirelessly transferred, including to a local base station laptop or notebook computer, for further analysis. Wireless or wired transfer may use the TCP/IP protocol or another protocol.

It should be understood that the amount of data communicated for monitoring 24-hours a day, seven days a week ("24-7 monitoring") is not an excessive amount. Therefore, low bandwidth and correspondingly low power implementations may be used without negatively impacting monitoring capability.

Figure 5:
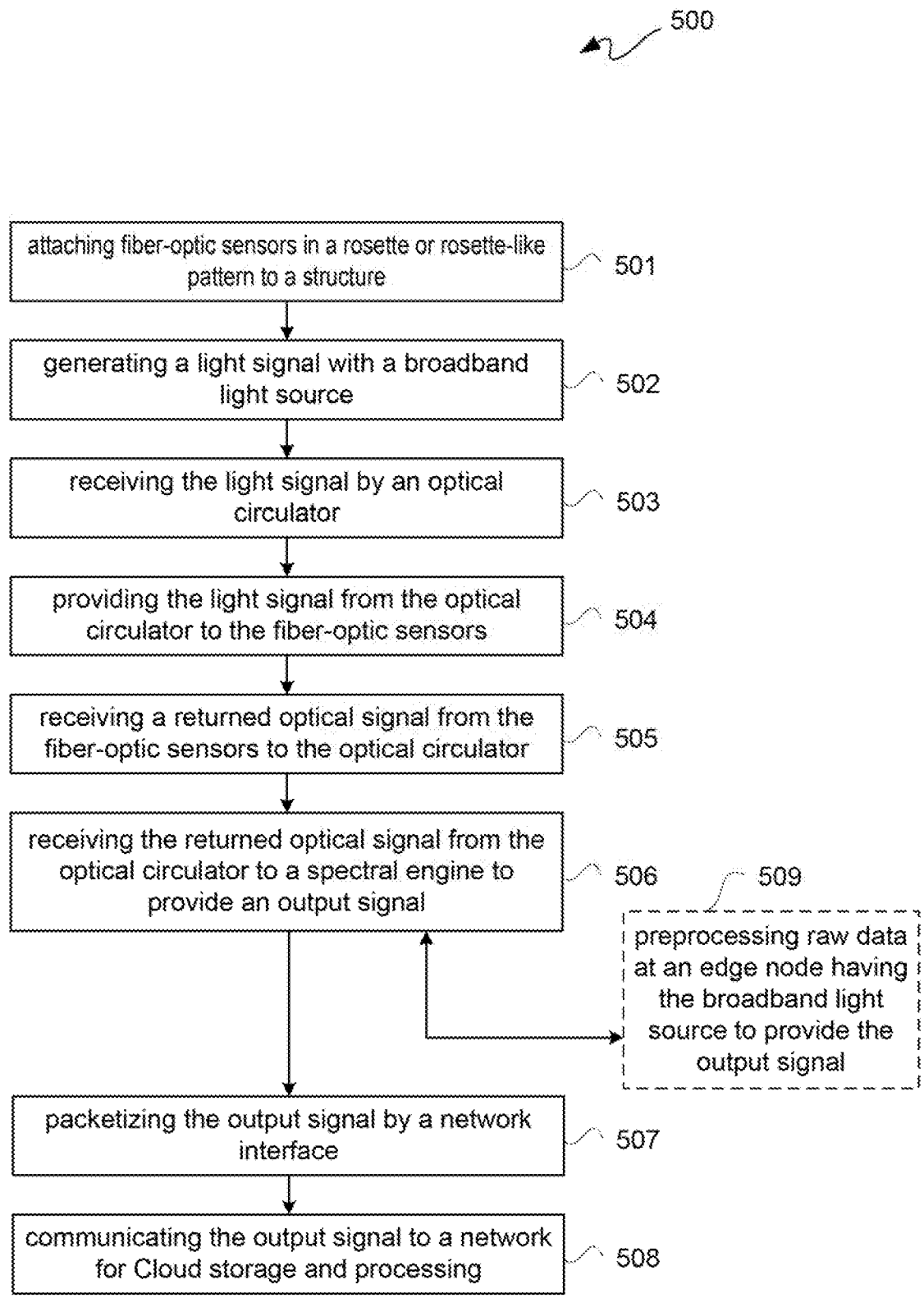
FIG. 5 is a flow diagram depicting an exemplary fiber-optic strain sensing flow.

FIG. 5 is a flow diagram depicting an exemplary fiber-optic strain sensing flow 100. Fiber-optic strain sensing flow 100 of FIG. 5 is further described with simultaneous reference to FIGS. 1 through 5.

At operation 501, FBG fiber-optic sensors 111 are attached in or as a rosette or rosette-like pattern 310 to a structure 401. At operation 502, a light signal is generated with a broadband light source 105.

At operation 503, such light signal generated by broadband light source 105 may be received by an optical circulator 106. At operation 504, such light signal may be provided from optical circulator 106 via optical fiber 101 to FBG fiber-optic sensors 111.

At operation 505, a returned optical signal from FBG fiber-optic sensors 111 may be received by optical circulator 106 via optical fiber 101. At operation 506, such returned optical signal may be provided from optical circulator 106 to a spectral engine 112 to provide an output signal. Such returned optical signal may include peaks associated with plane strain obtained by at least one first Fiber Bragg grating sensor of FBG fiber-optic sensors 111 having either a directionally normal x-axis position or a directionally normal y-axis position and by a second Fiber Bragg grating sensor of FBG fiber-optic sensors 111 having an x-y position.

Optionally, at 506, a preprocessing operation at 509 may be used. Along those lines, raw data of a returned optical signal may be preprocessed, such as with an SoC as described herein or other IC device, of an edge node having a broadband light source such as for example fiber-optic sensing system 119 of a Cloud connected system, to provide such an output signal. Such preprocessing may be used to reduce bandwidth used in transmitting raw data and/or to increase overall system processing capability, which may be used to enhance speed of analytics processing by a Cloud-based computing system. Optionally, such raw data may be sent with or without preprocessed results obtained from edge node processing of such raw data. Such preprocessed raw data may be for extracting data associated with features of such raw data to obtain a subset of such raw data. An FPGA-based or other microcontroller may be configured to send raw, processed, and/or feature extracted data from such an FPGA-based SoC to a Cloud-based computing system for archival, analytics, functions, and/or visualization.

At operation 507, such output signal may be packetized by a network interface 201. At operation 508, such output signal may be communicated, via hardwire or over-the-air wireless connection, to a network for Cloud storage and processing, as previously described.

Using a low-power SHM with FBG rosettes to monitor, including without limitation to continuously monitor, for damage precursors, such as for example principal strain direction changes, a higher power AE sensor interrogation may be activated responsive to detection of strain from such monitoring. As previously described, low-power SHM using FBG rosettes may be used to continuously monitor for changes in a host structure's principal strain direction. Detection of strain by such a FOS system 100 or 200 may suggest damage. Along those lines, detection of strain by an FOS system 100 or 200 may be used to automatically trigger a higher power AE sensor to provide for better characterization of such suspected damage.

Unlike traditional "always on" AE platforms, having an FOS system detection trigger an AE platform may use less power. Furthermore, wireless communication between an FOS system and an AE platform, namely between different sensing platforms, may be used to further support an Internet of Things ("IoT") implementation. For example, a combination of fiber-optic sensor rosettes for strain monitoring and a fiber-optic sensor for acoustic emissions monitoring may be attached to a structure, and may be used to sample data in an area and to monitor crack initiation and propagation.

Along those lines, passive principal strain direction monitoring may be used as a damage initiation trigger for one or more active sensing elements, including without limitation for example acoustic emissions sensors. Along those lines, AE sensors can be combined with one or more FOS systems to provide for damage location, and such AE sensors can be powered on-demand, periodically, and/or responsive to an FOS system detection to further establish reliability while preserving an energy efficient implementation.

Generally, IoT involves integration of physical objects and wireless networks by instrumenting these objects with sensors and actuators. IoT technology has gained attraction in various industries such as transportation, health care, military, security, manufacturing, and many others. Infrastructure health monitoring is one of the areas where IoT can significantly increase accuracy and accessibility that conventional approaches fail to provide. IoT technology may combine environmental and physical parameter sensing with data transmission and processing, such as through wireless communication techniques or wireless sensor networks, providing an effective platform to combine SHM, Condition Based Monitoring ("CBM"), and/or Prognostic Health Management ("PHM").

Low-cost and low power fiber optic sensors may be used for continuous monitoring with real-time data collection and analysis. Once sensor data is collected, processed, transmitted, and analyzed, structural damage can be successfully detected or predicted. Generally, long-term health monitoring of structures as described herein has capability for effective structural management, predictive maintenance and/or safe operation.

As described below in additional detail, FOS systems 100 or 200 may be combined with AE interrogation. For example, an FOS system 100 or 200 may use an SLED for a light source, and AE interrogation node may use a distributed feedback ("DFB") laser for a light source. Both light sources and associated signal conditioning hardware may be integrated into a single module to provide combined AE and dynamic strain measurements.

For AE detection, light from a DFB laser may be sent to a FBG-based AE transducer ("FBG transducer"). Light reflected from such FBG transducer may be detected by a photodetector, such as an InGaAs photodetector. Light converted by such photodetector into a demodulated analog electrical signal may be digitized, such as using an A/D converter of a data acquisition module or board. For example, with digital tracking control, such a DFB laser may be continuously locked to a mid-reflection wavelength of such an FBG transducer for ultrasonic wave detection. Such a demodulated photodetector signal may be interfaced to a compact, high-speed data acquisition board for signal processing and storage. AE extracted data may be wirelessly sent to a base station laptop for display and analysis, such as using a ZigBee protocol for example.

AE detection may also be used for strain measurements with a sub-microstrain resolution, namely generally involving minimally pico-meter wavelength detection sensitivity. Detection of such a small wavelength shift may be obscured by environmental and system noise. To effectively remove a noise contribution, the output signal of a photodetector may be fed into a digital feedback controller, which in turn provides a feedback signal for laser control electronics. This laser tracking scheme allows a laser wavelength to be continuously locked to a stable point at a mid-reflection wavelength of a Bragg grating to produce a high signal-to-noise ratio for providing a direct strain measurement via a generated output error signal. Due to out-of-band noise rejection by a feedback controller, a resulting signal-to-noise ratio may be enhanced, permitting sub-microstrain detection sensitivity. Once a laser is locked, a DC strain signal is generally stable, and laser wavelength may be highly resistant to environmental noise that tends to move a laser wavelength away from a stable point to which it is locked. This system stability may provide both improved signal-to-noise strain measurements and reliable AC strain and ultrasonic wave detection.

Optionally, as described below in additional detail, all or a portion of an FOS systems 100 or 200 may be combined with AE interrogation to provide a wavelength tracking system. For example, an FOS system 100 or 200 may use an SLED for a light source, and AE interrogation node may use one or more lasers, such as a distributed feedback ("DFB") laser for example, for a light source. Both light sources and associated signal conditioning hardware may be integrated into a single module to provide combined AE and dynamic strain measurements with dynamic wavelength tracking. Such tracking may be used to tune a laser wavelength responsive to a shift in an FBG wavelength. This shift may for example be due to damage to a structure.

Figure 6:
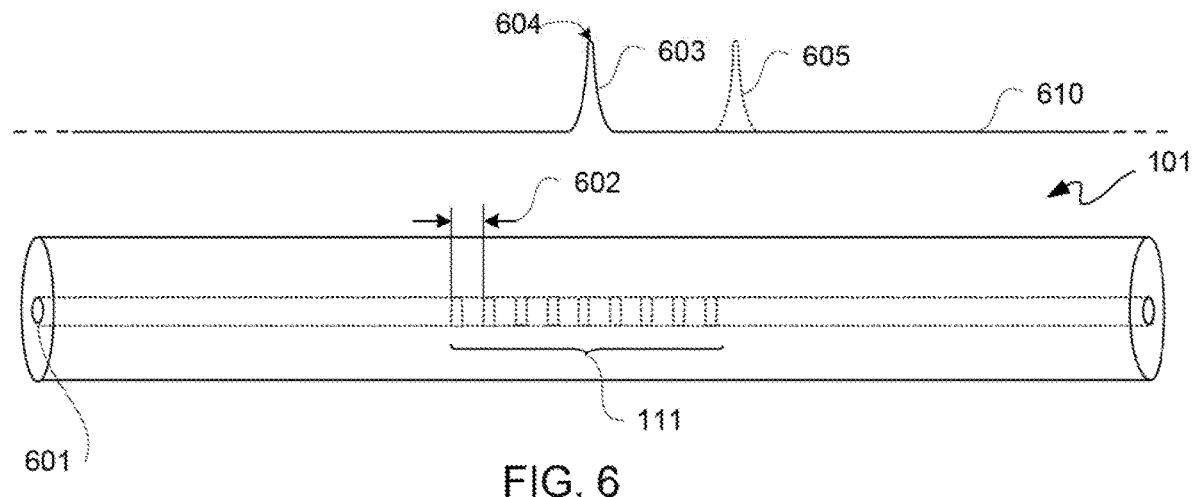
FIG. 6 is a perspective side view depicting an exemplary optical fiber and a corresponding reflected signal.

FIG. 6 is a perspective side view depicting an exemplary optical fiber 101 and a corresponding reflected signal 610. Optical fiber 101 may have a fiber core 601. Fiber core 601 may include FBG fiber-optic sensors 111 inscribed on single-mode photosensitive silica-based fibers, such as Ge/B doped silica fibers for example. Input edge-to-input edge spacing 602 between neighboring FBG fiber-optic sensors 111 may be Λ, and refractive indexes η of FBG fiber-optic sensors 111 may be different from one another, such as $\eta_0$ through $\eta_3$ for example, for forming a Bragg grating.

A sensor rosette patch, such as previously described, may be coupled to a miniaturized interrogation device including a stand-alone compact multichannel fiber optic strain interrogator with optional wireless data acquisition. Optionally, such interrogator may be coupled to an energy harvesting device. Such a fiber-optic sensor may be: only a few grams in weight (e.g., 10 grams or less for sensor weight); compact (e.g., 0.2 mm×2 mm×1 cm or smaller); responsive (e.g., a response time of measured in a few milliseconds or less); immune to EM interference; and highly sensitive to strain and stress wave signals from DC to ultrasonic frequency with flat (e.g., no resonance) response. Such a sensor may be passive, so as not to consume power. Such a sensor size may be multiplexed along length of an optical fiber 101. Such a sensor may have an AE resolution of sub-nanostrain and a load resolution of sub-microstrain.

A core refractive index of fiber bore 601 may have a digital clock-like pattern corresponding to FBG fiber-optic sensors 111 and spacings 602. Spectral response of an input signal may be different than spectral response of a transmitted signal, and spectral response of a transmitted signal may be different than spectral response, such as spectral response 610 for example, of a reflected signal.

With respect to a spectral response 610 of a reflected signal from FBG fiber-optic sensors 111, under an unstrained or baseline condition for optical fiber 101, such reflected spectral response 610 may appear as an impulse 603 centered at a Bragg wavelength 604 or $\lambda_B$. However, under a strained or non-baseline condition for optical fiber 101, such reflected spectral response may appear as an impulse centered at a wavelength other than a Bragg wavelength, such as generally indicated by an example impulse 605 shifted in wavelength away from impulse 603. This wavelength shift may be detected and correlated to strain causing such wavelength shift.

Discrete sensing using FBG fiber-optic sensors 111 as point sensors, with a laser or broadband light source, may be implemented to measure strain, temperature, pressure, vibration, and/or AE. However, distributed sensing using FBG fiber-optic sensors 111 may be implemented using a pulse laser light source and generally an entire sensing length of an optical fiber 101, such as a silica fiber (e.g., a pure silica fiber) as a sensing medium. Such distributed sensing may be used to measure strain, distributed temperature sensed ("DTS"), and/or distributed acoustics sensed ("DAS").

Figures 1, 7:
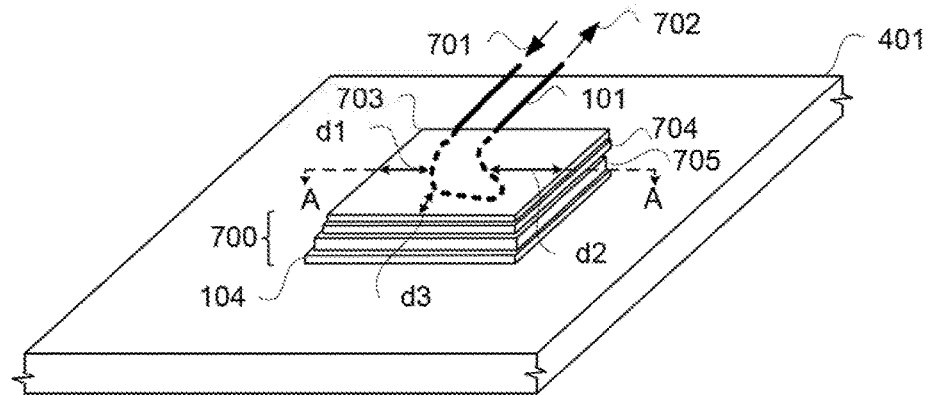
Figures 2, 7:
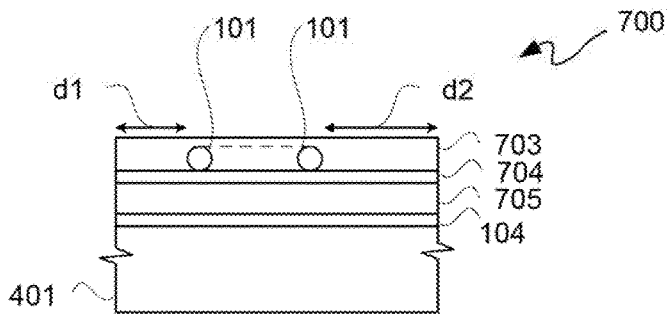

FIG. 7-1 is a block diagram of a perspective view depicting an exemplary patch 700 attached to a host structure 401. FIG. 7-2 is a block diagram of a cross-sectional view along A-A of patch 700 of FIG. 7-1. With simultaneous reference to FIGS. 1 through 7-2, patch 700 is further described. Patch 700 is an example of a substrate 313.

Patch 700 may have a single FBG sensor or more than one FGB sensor. One or more patches 700 may be used to provide a rosette or rosette-like pattern 310. A rosette or rosette-like pattern 310 may be formed by having one or more optical fibers 101 coupled and/or taped down to a backing 705.

In this example, backing 705 may be formed using one or more flexible thin films with an FBG baseline strain after embedding. Backing 705 thickness, width, and/or length may be adjusted according to an application. For example, a bond ply used in flexible printed circuit industry or other suitable flexible substrates may be use together with epoxies to bond an entire FBG sensor rosette pattern 310, including the grating and non-grating fiber sections of three optical fibers 101. Thus even though only one optical fiber 101 is illustratively shown for purposes of clarity, it should be understood that more than one optical fiber 101 may be attached to a patch 700. Moreover, an input end 701 of a section of optical fiber 101 may be used for receiving a transmitted optical signal, and an output end 702 of such section of optical fiber 101 may be used for reflecting back a reflected optical signal associated with such transmitted optical signal.

Patch 700 may be bonded directly with a bonding material 104 to a surface of a host structure 401 to be monitored. A bonding material 104 layer may be used to couple backing 705 to host structure 401.

An encapsulation material suitable for use with FBG sensors may optionally be used for a stronger strain coupling to a host structure to be monitored. Such encapsulation material may be for additional protection from environmental forces and/or structural integrity. In this example, an encapsulation layer 703 is used to encapsulate a section of optical fiber 101, including at least the entirety of an FBG sensor thereof. Optionally, an adhesive film 704 may be used to couple a section of optical fiber 101 to backing 705 prior to encapsulation by encapsulation layer 703.

For example, Dupont Kapton® polyimide film backing from CS Hyde Company coupled with Henkel-Adhesives Hysol® 9696 adhesive film may be implemented optionally with a polyurethane protective film layer for encapsulation. Hysol® film parameters published by the vendor include a thickness of 0.001 in. and a tensile strength of 30 ksi. A polyurethane protective film layer can be thermoformed around a section of optical fiber 101 to provide protection from environmental factors while minimizing any effects on structural coupling of one or more FBG fiber-optic sensors 111 to a host structure 401.

Geometry may be optimized for maximum strain transfer from a host structure to FBG fiber-optic sensors 111. For example, positioning of patch edges with respect to FBG fiber-optic sensors 111 may be used to reduce or minimize edge effects at the location of FBG fiber-optic sensors 111. Accordingly, distances d1, d2, and d3 from outer edges of optical fiber 101 to corresponding outer edges of encapsulation layer 703 or backing layer 705, as applicable, may be adjusted to reduce or minimize edge effects.

Thickness and material properties of a backing and one or more adhesive layers may impact the transfer of strain. Along those lines, backing 705 may be expanded to allow integration of FBG fiber-optic sensors 111 to form a rosette or rosette-like pattern 310 on a single patch. Once a geometric arrangement for FBG fiber-optic sensors 111 of a patch 700 is determined, such as by finite element analysis, at least two FBG fiber-optic sensors 111 may be encapsulated in a rosette or rosette-like pattern 310. In the above example of FIG. 3, three FBG fiber-optic sensors 111 are encapsulated for a patch 700.

For example, to precisely control the orientation of FBG fiber-optic sensors 111 to create a rosette pattern 310, a stencil may be created, such as by laser cutting a thin sheet of plastic in a desired geometry for example. Adhesive may be placed within stenciled areas, and FBG fiber-optic sensors 111 may be set in place in such stenciled areas. Such stencil may be removed while adhesive is curing. A protective encapsulation layer may be applied, and a heat gun may be used to provide sufficient temperature to thermoform such protective encapsulation layer to such patch assembly, including eliminating any air-gaps.

Figure 8:
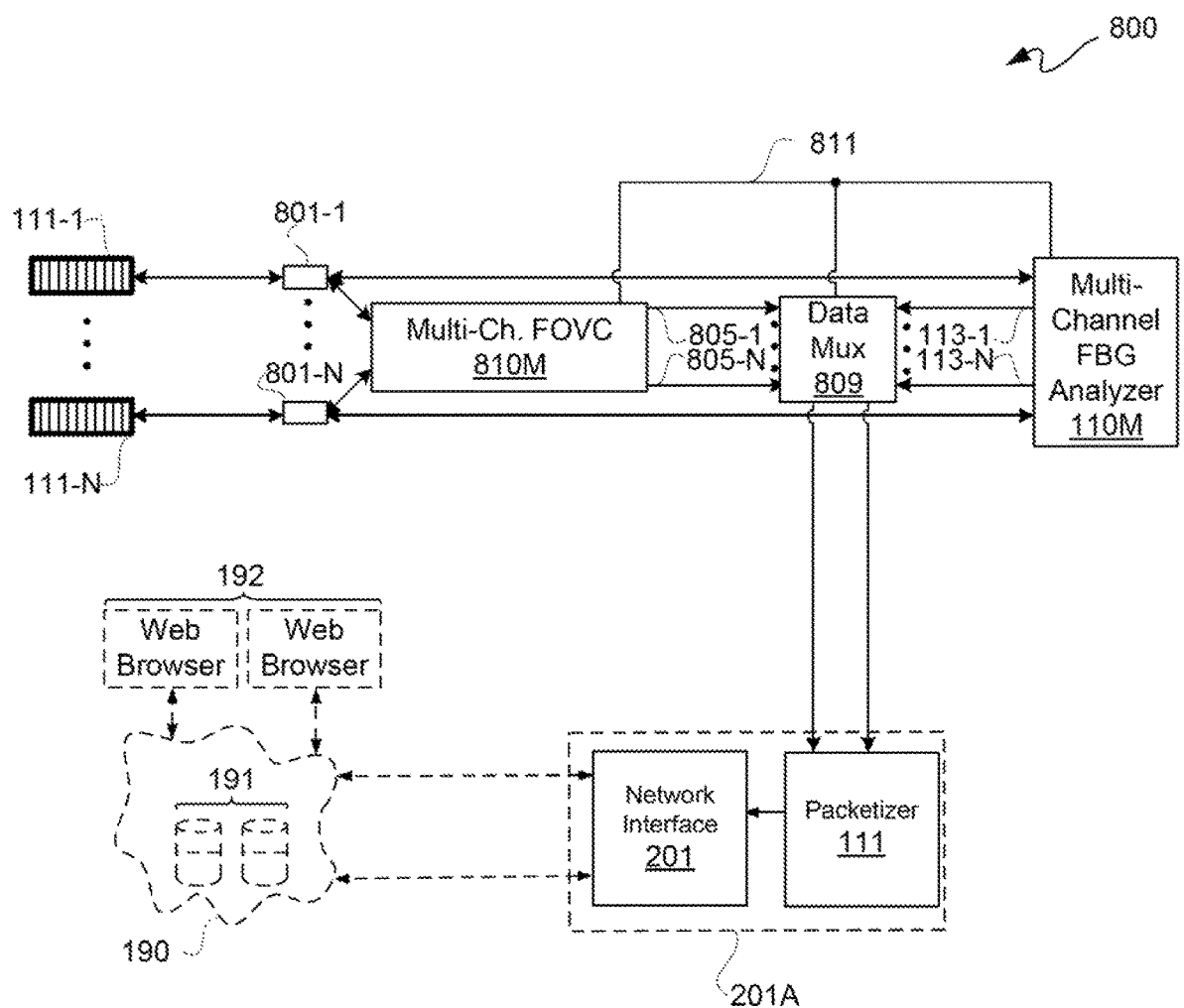
FIG. 8 is a block diagram depicting an exemplary acoustic emission ("AE") and FOS system.

With respect to AE and strain, FIG. 8 is a block diagram depicting an exemplary AE and FOS system 800. In this example, there are N, for N a positive integer greater than one, FBG fiber-optic sensors 111-1 through 111-N coupled through corresponding optical multiplexers or optical circulators 801-1 through 801-N to a multi-channel fiber optic voltage conditioning ("FOVC") 810M and a multi-channel FBG analyzer 110M. Even though a multi-channel FOVC 810M and a multi-channel FBG analyzer 110M are described, a single-channel FOVC 810 and a single-channel FBG analyzer 110 may be used in another implementation as follows from the more complex description of a multi-channel implementation.

Multi-channel FOVC 810M and multi-channel FBG analyzer 110M may be operated out-of-phase with respect to one another in order to share FBG fiber-optic sensors 111-1 through 111-N. For example, multi-channel FOVC 810M and multi-channel FBG analyzer 110M may be operated or active on opposite states of a sync control signal 811 coupled to multi-channel FOVC 810M and multi-channel FBG analyzer 110M.

A detailed description of a multi-channel FOVC may be found in U.S. patent application Ser. No. 14/814,355. However, this or another type of multi-channel FOVC compatible with an FBG sensor may be used.

On a timing interval of control signal 811 for which multi-channel FOVC 810M is to be active, multi-channel FOVC 810M may transmit signals to FBG fiber-optic sensors 111-1 through 111-N to receive corresponding returned signals. Multi-channel FOVC 810M may process such returned signals to provide ADC converted voltage analog outputs as digital data outputs 805-1 through 805-N corresponding to such returned signals. Such digital data outputs 805-1 through 805-N may be provided to a data multiplexer ("mux") 809.

Control signal 811 may optionally be used for providing a control select to mux 809 for selecting either digital data outputs 805-1 through 805-N or digital data outputs 113-1 through 113-N for an interval of a cycle of control signal 811. Along those lines, a 50-50 duty cycle or other duty cycle commensurate with timing of operations of multi-channel FPVC 810M and multi-channel FBG analyzer 110M may be used.

On a timing interval of control signal 811 for which multi-channel FBG analyzer 110M is to be active, multi-channel FBG analyzer 110M may transmit signals to FBG fiber-optic sensors 111-1 through 111-N to receive corresponding returned signals. Multi-channel FBG analyzer 110M may process such returned signals to provide ADC converted voltage analog outputs as digital data outputs 113-1 through 113-N corresponding to such returned signals. Such digital data outputs 113-1 through 113-N may be provided to a mux 809.

A selected output of mux 809 may be provided to a packetizer 111, which may be time-slice shared by multi-channel FPVC 810M and multi-channel FBG analyzer 110M for wireless transmission of data, such as previously described and not repeated here for purposes of clarity and not limitation.

Figures 1, 9:
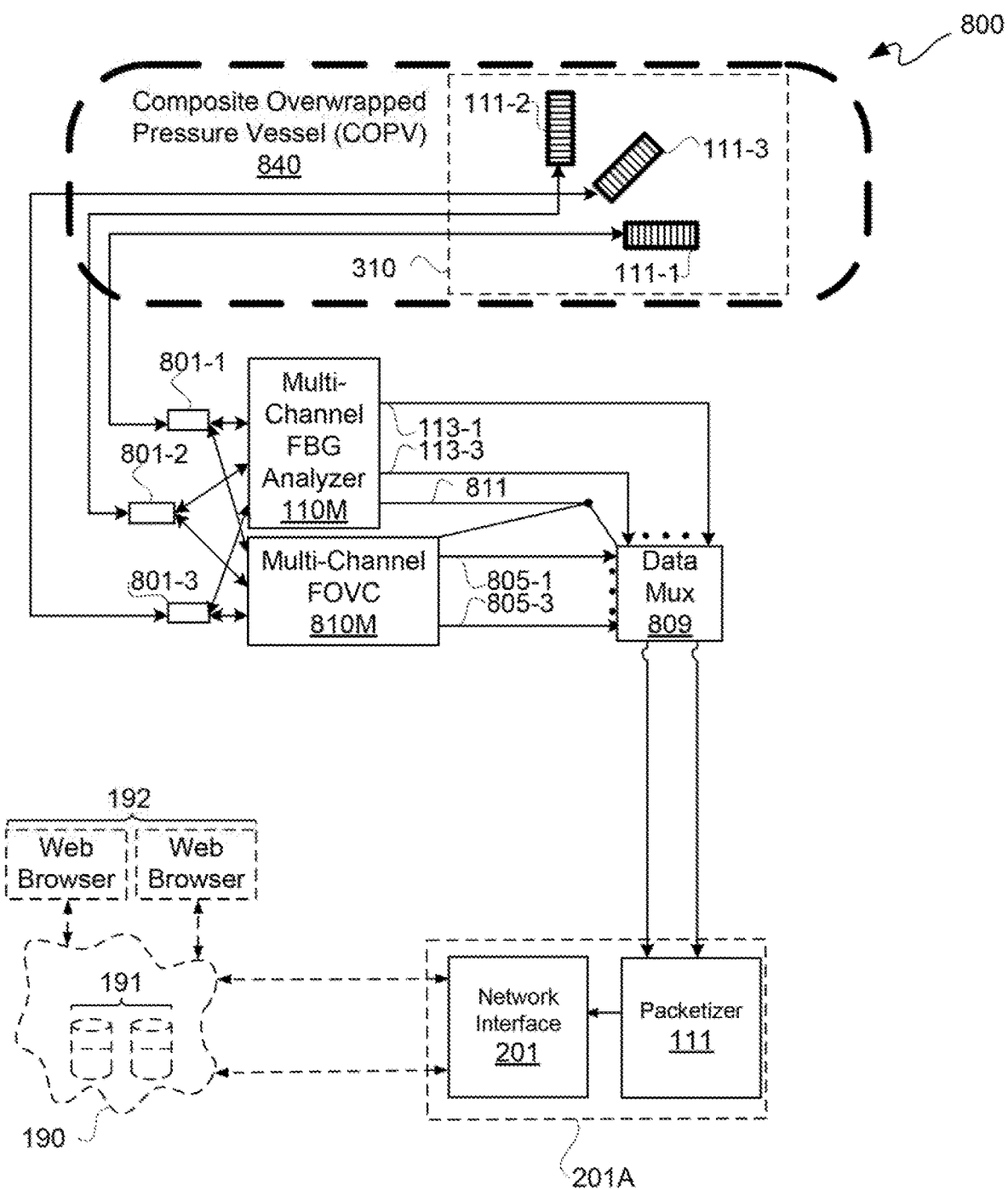
Figures 2, 9:
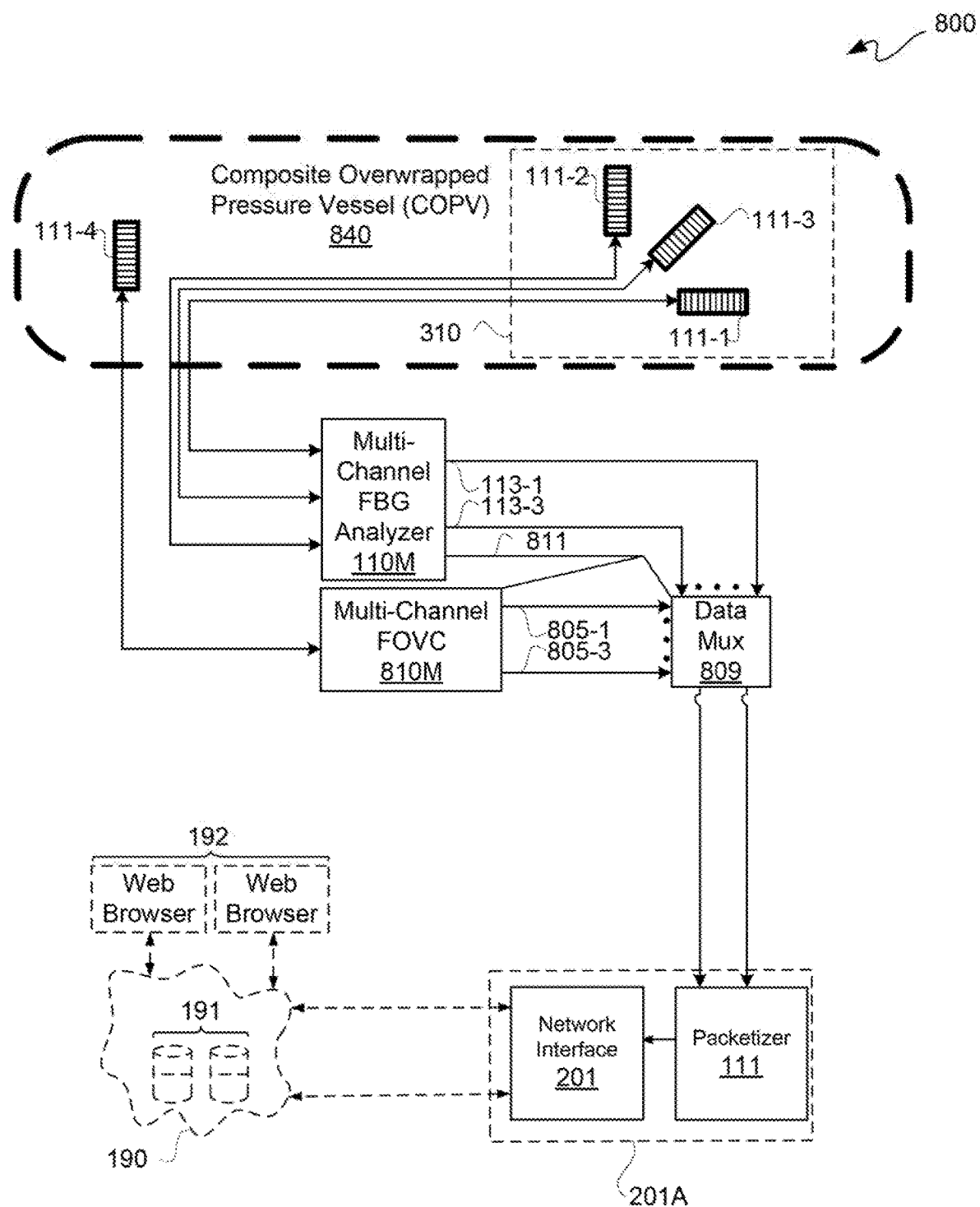

FIG. 9-1 is a block diagram depicting exemplary AE and FOS system 800 of FIG. 8 optionally coupled to a Composite Overwrapped Pressure Vessel ("COPV") 840. Though a COPV 840 is used for a structure 401, another type of structure may be used. Furthermore, a structure other than a tank or vessel may be used. For example, a pipe or other conduit may be monitored for leaking, cracking or other damage. Moreover, a structure may be a power station or other large power transformer, and AE and FOS system 800 may be for monitoring for partial discharge and/or physical damage.

In this example, three FBG fiber-optic sensors 111-1 through 111-3 are coupled to COPV 840 in a rosette or rosette-like pattern 310. However, fewer or more than three FBG fiber-optic sensors may be used in other implementations.

FBG fiber-optic sensors 111-1 through 111-3 may be corresponding coupled to three optical multiplexers or optical circulators 801-1 through 801-N. Thus, COPV 840 may be monitored for leaking, cracking, or other conditions indicating current or potential damage or tampering. Optionally, COPV 840 may be monitored for temperature with an FBG fiber-optic sensor, as previously described.

FIG. 9-2 is a block diagram depicting exemplary AE and FOS system 800 of FIG. 8 coupled to COPV 840. However, in this example, FBG fiber-optic sensors 111-1 through 111-3 are not shared as between multi-channel FPVC 810M and multi-channel FBG analyzer 110M. Rather, a separate FBG fiber-optic sensor 111-4, which is not part of a rosette or rosette-like pattern 310, is separately directly coupled to COPV 840 for direct communication with multi-channel FPVC 810M. Along those lines, optical multiplexers or optical circulators 801-1 through 801-3 used for sharing FBG fiber-optic sensors may be omitted in this example.

In this example, three FBG fiber-optic sensors 111-1 through 111-3 are coupled to COPV 840 in a rosette or rosette-like pattern 310. FBG fiber-optic sensors 111-1 through 111-3 may be corresponding coupled to three channels of multi-channel FBG analyzer 110M.

Thus, COPV 840 may be monitored for leaking, cracking, or other conditions indicating current or potential damage or tampering. Optionally, COPV 840 may be monitored for temperature with an FBG fiber-optic sensor, as previously described.

Figures 1, 10:
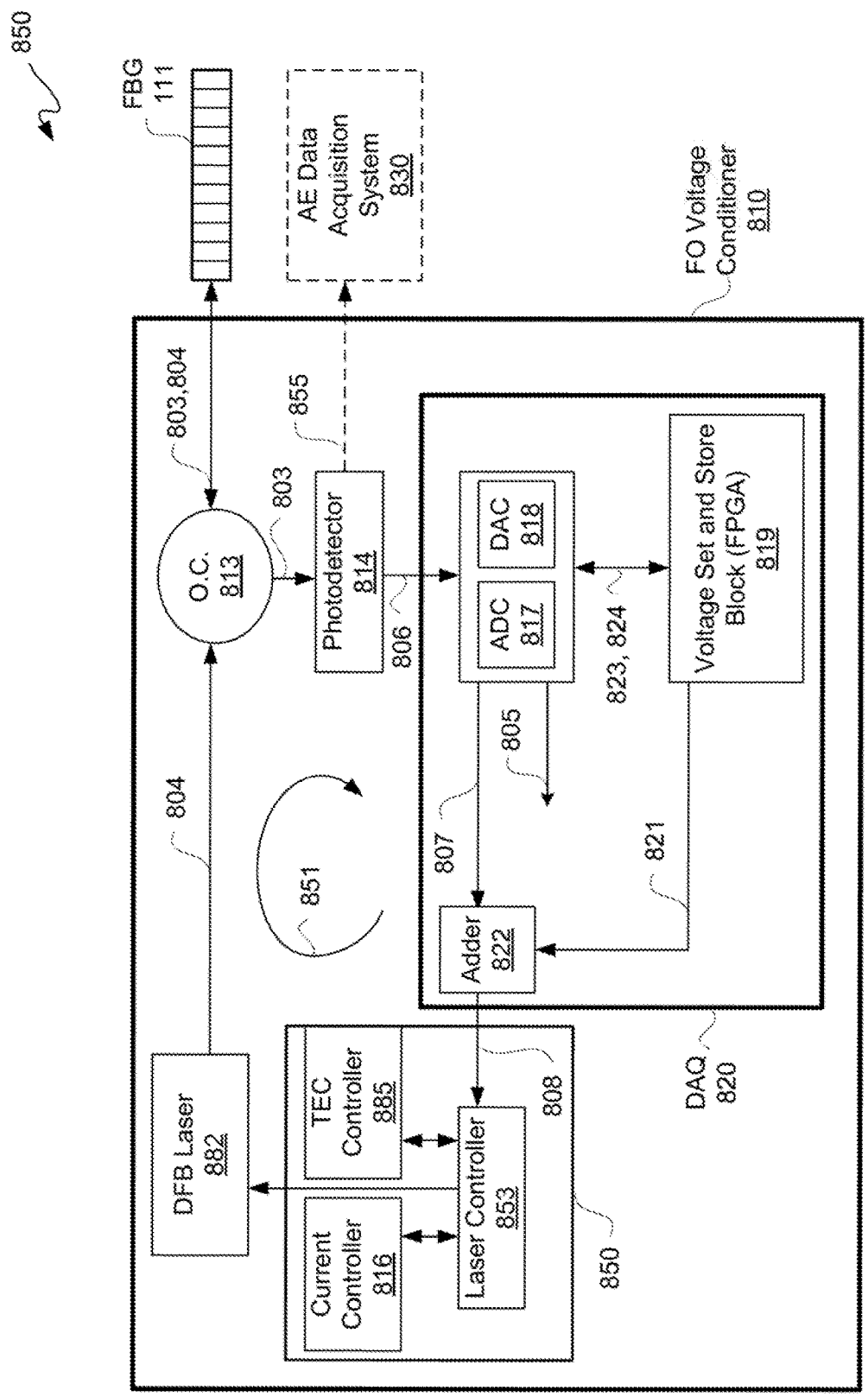
Figures 2, 10:
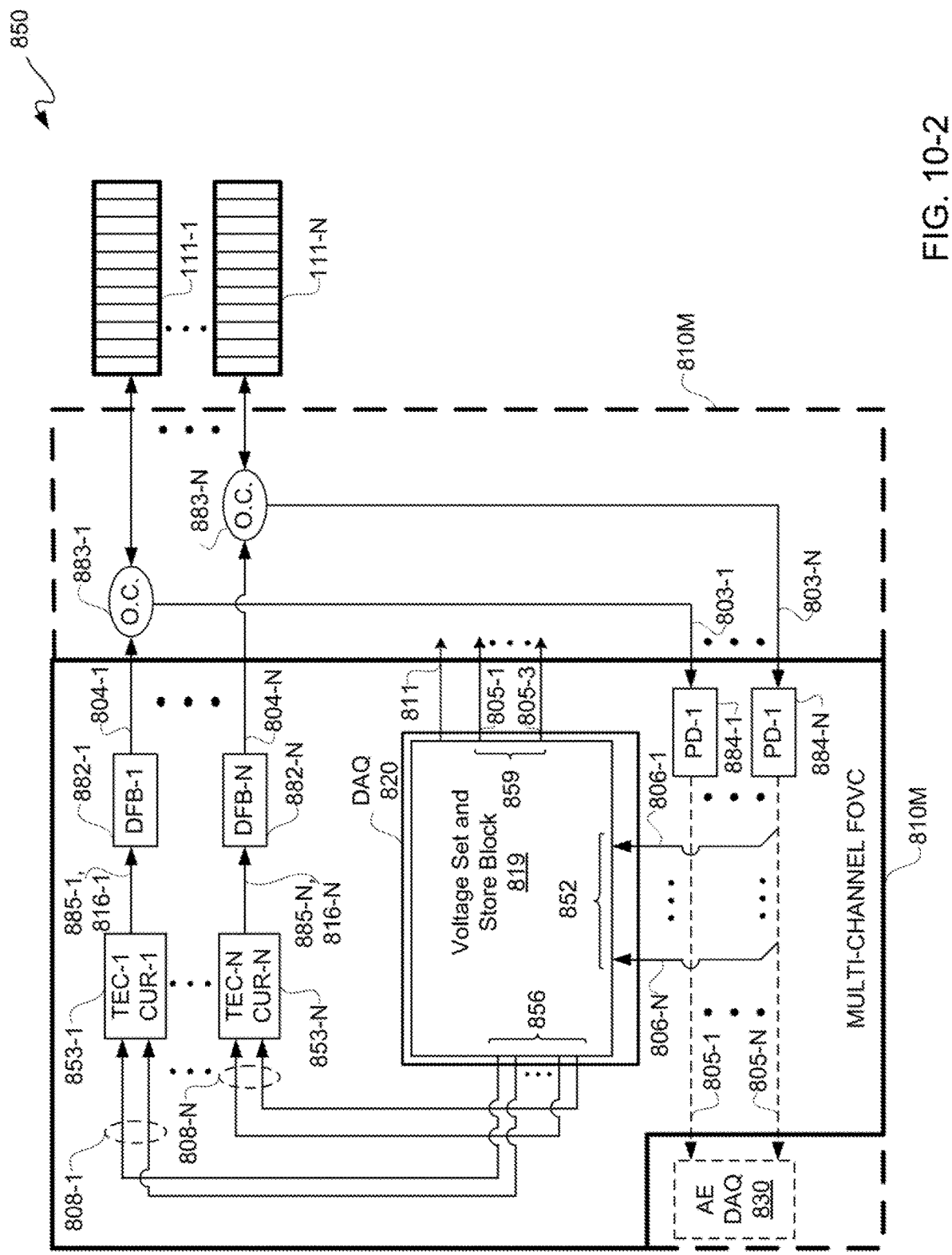

FIG. 10-1 is a block diagram depicting an exemplary single-channel laser tracking-based fiber optic voltage conditioning system 850. In order to provide voltage conditioning for acoustic emissions ("AEs") measurements, an open/closed loop control 851 of FOVC 810 of fiber optic voltage conditioning system 850 may be used to actively track a laser to Bragg wavelength of an FBG fiber-optic sensor 111.

A function of laser tracking-based FOVC 810 may be to provide fiber optic voltage conditioning of returned optical signal 803 coupled to FBG sensors (collectively and singly "FBG sensor") 111 via a fiber optic cable or line, as described below in additional detail. Along those lines, a multifunction fiber optic sensor, such as fiber Bragg grating sensor, may be used. For AE measurements, using a fiber Bragg grating sensor in a fiber optic housing, an entire sensing area can be bonded directly to a surface of a structure ("measurement surface") such as with a permanent epoxy or other bonding material. The direct bonding of a bare fiber to a measurement surface may provide a high-level of stress wave coupling from such measurement surface to a sensing area.

However, over time such bonding material may result in local stress along such Bragg grating sensor, such as along a grating length for example, and this may lead to creation of an unstable optical cavity formed by multiple gratings, such as along such grating length for example. These optical cavities may negatively affect FOAE sensor performance by changing the slope of a Bragg reflection spectrum and/or increasing Fabry-Perot noise. To address this issue, an overhanging ridge configuration may be used, where a grating under tension may be used for hanging over two stand-offs bonded to a structure's surface to address the above-described problem, such as for AE and/or strain sensing. Moreover, for an overhanging ridge configuration, a grating may be used for hanging over shear wave-coupling gel, on either or both sides thereof, to provide a flexible bonding to a structure's surface to address the above-described problem, such as for AE and/or temperature sensing. Optionally, a package sensor multiplexing two or more FBG sensors on the same package with different Bragg wavelengths installed can be multiplexed in serial or parallel. Such a package sensor may be used for AE, strain, and/or temperature sensing. Moreover, optionally a multiplexed-multi-sensing package sensor may be used. For example, two or more different types of sensors (e.g., AE/strain and AE/temperature) can be multiplexed on the same package for multi-sensing.

Optionally, another function of such laser tracking-based FOVC 810 may be to convert returned optical signal 803 from FBG sensor 111 to an optional AC voltage analog output 855 that may directly interface with conventional AE instrumentation, which is illustratively depicted as optional AE data acquisition system 830. An optional analog signal output 855 of FOVC 810 may resemble that of a piezo-electric sensor used in conventional AE measurements, facilitating sensor "drop in replacement".

Along those lines, conventional piezo-electric sensors/preamplifier signal conditioners can be completely replaced with a combination of FBG sensor 111 and FOVC 810 as described herein without changing existing AE software and electronics of conventional AE data acquisition systems, such as AE data acquisition system 830 for example, leading to significant cost saving through minimizing additional hardware/software installation. In other words, a high-frequency, high-gain photodetector output 805 carrying a high frequency signal may be interfaced directly to an analog input of a conventional AE data acquisition system 830, such as a Mistras PCI-2 DAQ board from Mistras Group, Inc. of Princeton Junction, N.J., for example.

Light 804, which may be from a compact, commercially available distributed feedback ("DFB") laser or other laser 882, may be passed via an optical circulator 883 to an FBG sensor 111. A returned optical signal 803 from FBG sensor 111 passing through optical circulator 883 may be routed to a photodetector 884. Current control 816, which may be separate from or part of DFB laser 882, may be initially set at a midrange value between a lasing threshold and a maximum current limit, and a thermoelectric cooler ("TEC") control 885, which may be separate from or part of DFB laser 882, may be tuned to move laser wavelength to a mid-reflection point ("V REF") of a Bragg wavelength of FBG sensor 111.

With laser current and TEC control voltages settled at initial set points, namely V TEC SET and V CUR SET 821, laser wavelength may be locked to a mid-reflection point of FBG sensor 111 using simultaneous TEC and current tracking through a closed loop 851 proportional-integral-derivative ("PID") feedback control.

For adjustment for real-time laser tracking control, a chip-based data acquisition ("DAQ") board 820, such as an FPGA-based or other System-on-Chip-based ("SoC-based") circuit board, may be used to record at least one of a low-gain and/or low-frequency of photodetector output signal 806, namely as associated with an analog input to analog-to-digital converter ("ADC") 817 and to generate a PID control signal 807 of DAC 818.

By "low-gain" and "low-frequency", it is generally meant an analog output signal being below both a threshold gain and a threshold frequency, respectively, where such thresholds represent an external environmental change and/or perturbation, including without limitation a change in one or more of temperature, strain, pressure, and/or stress of a structure under test, including a structure being monitored, as sensed by one or more FGB sensors coupled to one or more optical fibers. Accordingly, such thresholds may vary from application-to-application depending upon the type of structure being tested, as well as use of such structure.

An analog output signal 806 of photodetector 884 may be converted to a digital data output signal 805 by ADC 817, and a digital output of ADC 817 may additionally feed an input of a voltage set and store block 819. A digital output of voltage set and store block 819 may feed an input of DAC 818 to provide an analog PID control signal 807. PID control signal 807 may include a PID current error ("CUR ERR") signal and a PID TEC error ("ERR") signal. PID control signal 807 may be output from DAC 818.

For purposes of clarity by way of example and not limitation, it shall be assumed that an FPGA is used to set and store voltages; however, in another implementation another type of SoC may be used, including without limitation an ASSP, ASIC, or other IC. Along those lines, voltage set and store block ("FPGA") 819 may be used to set and store a laser current voltage and a TEC control voltage, namely V TEC SET and V CUR SET 821, and FPGA 819 may be used to store a mid-reflection point V REF of a Bragg wavelength of FBG sensor 111. FPGA 819 may be coupled to receive a digital output 823 from ADC 817, where such digital output 823 is a conversion of an analog photodetector output signal 806. FPGA 819 may be configured to generate and store TEC and laser current error voltages, namely a V TEC ERR and a V CUR ERR, using such digital output 823 received. FPGA 819 may provide a digital PID control signal 824, where such digital PID control signal includes a V CUR ERR signal and a V TEC ERR signal, to DAC 818, and DAC 818 may convert such digital PID control signal 824, namely a V TEC ERR signal and a V CUR ERR signal, to analog PID control signal 807 having analog PID CUR ERR and PID TEC ERR signals.

PID CUR and TEC error signals from PID control 807 may be correspondingly added to CUR and TEC set voltages 821 by adder 822, and respective sums 808 output from adder 822 may be fed into a controller 850 for adjustment of control information provided to laser 882. In this example, for purposes of clarity and not limitation controller 850 is broken out into three controllers or modules, namely a laser controller 853 coupled to a current controller 816 and a TEC controller 885. However, in another implementation, current controller 816 and/or TEC controller 885 may be part of a laser, such as DFB laser 882 for example. Sums 808 may be used together to compensate for drift of a Bragg wavelength, such as due to external environmental changes and/or perturbation including without limitation changes in one or more of temperature, strain, pressure, and/or stress, by actively tuning laser wavelength responsive to such current and TEC control. Even though a DFB laser 882 is used, in another implementation a broadband light source or other type of light source may be used.

In this example, both laser TEC and current are used simultaneously to compensate for FBG wavelength drift from DC up to approximately 20 kHz for photodetector output signal 806. TEC tracking may be provided by changing temperature of DFB laser 882 via TEC control 885 to compensate for FBG sensor 111 wavelength drift caused by environmental changes. While providing large dynamic range, such as for example approximately several thousand microstrains for strain monitoring, TEC compensation may be slow, with a maximum response time in the order of seconds or longer.

In this example, fast, such as for example a few Hz to 20 kHz or higher, real time compensation may not be possible with TEC tracking. Along those lines, laser current compensation, as described herein, may be used with a much higher response time, possibly up to approximately 20 kHz or higher, subject to limitations of response time of electronics of laser controller 853, and such laser current compensation may be used simultaneously with TEC tracking. Tracking by changing laser injection current may cause changes in both laser wavelengths and intensity, although with much more limited dynamic range, such as for example approximately several hundred microstrains for dynamic strain tracking. For larger dynamic strain monitoring, such as more than approximately a thousand microstrains, commercially available distributed Bragg reflector ("DBR") lasers can be used in place of DFB lasers. However, it should be appreciated that using TEC and current tracking in combination provides extended dynamic range and fast response for laser tracking.

Long-distance AE measurement using a laser-based FBG interrogation may be subject to presence of high amounts of optical noise associated with the Fabry-Perot effect generated by an optical cavity created by two or more reflective mirrors. By "interrogation," it is generally meant providing a light signal to an optical sensor coupled to a material or structure under test and obtaining a light signal in return from such optical sensor to obtain information therefrom regarding such material or structure under test. A Bragg grating itself may be considered a highly reflective mirror. In the presence of another reflective surface from an optical component, such as for example an optical circulator or a scattering center such as a local defect present in a long optical fiber, unstable, unwanted constructive optical interferences can be generated due to laser coherence. Accordingly such interferences may contribute to increased AE background noise, and as a consequence can significantly reduce a signal-to-noise ratio ("SNR") in AE measurements.

To suppress this optical noise, a combination of circulators and optical isolators between reflection and/or scattering surfaces may be used to provide unidirectional optical paths and avoid bidirectional optical paths between any two reflective optical components, such as described below in additional detail.

FIG. 10-2 is a block diagram depicting an exemplary multichannel FOVC system 850. Multichannel FOVC system 850 is further described with simultaneous reference to FIGS. 10-1 and 10-2.

In multichannel FOVC system 850, an N-channel FOVC 810M is respectively coupled to FBG sensors 111-1 through 111-N via corresponding optical circulators 883-1 through 883-N, for N a positive integer greater than one. FBG sensors 111-1 through 111-N may be respective discrete FOAE sensors or an array thereof.

DFB1 through DFBN lasers 882-1 through 882-N and corresponding photodetectors ("PD") PD1 884-1 through PDN 884-N may be respectively coupled to optical circulators 883-1 through 883-N. Each of DFB lasers 882-1 through 882-N may deliver corresponding laser lights 804-1 through 804-N respectively into FBG sensors 111-1 through 111-N via corresponding circulators 883-1 through 883-N. Circulators 883-1 through 883-N may then be used to pass corresponding returned optical signals 803-1 through 803-N respectively from sensors 111-1 through 111-N on a per channel basis. Returned optical signals 803-1 through 803-N may be respectively provided onto photodetectors 884-1 through 884-N.

Each of the outputs of photodetectors 884-1 through 884-N, which may be implemented in an example implementation as photodiodes ("PD") PD1 through PDN, may be split into two sections, namely analog signals 806-1 through 806-N and optionally analog signals 805-1 through 805-N. One group, namely a low frequency signal output group of signals 806-1 through 806-N, may be input into an analog input interface 852, such as respective analog input ports for example, of an FPGA-based data acquisition system 820 for laser tracking control generation as previously described herein. Another optional group, namely a high frequency signal output group of analog signals 805-1 through 805-N, may optionally be input to a conventional multichannel AE DAQ system 830 for AE measurement.

Even though an FPGA 819 is used as described herein for DAQ 820, another type of SoC, an ASSP, an ASIC, or other VLSI type of integrated circuit device may be used instead of FPGA 819. However, for purposes of clarity and not limitation, it shall be assumed that an FPGA 819 is used. Furthermore, DAC 820 may exist in a single integrated circuit device, whether such device is a monolithic integrated circuit or an integrated circuit formed of two or more integrated circuit dies packaged together.

An FPGA 819 may have sufficient resources for integration of one or more ADCs 817, one or more DACs 818, and/or one or more adders 822 therein for providing a multichannel FOVC 810M. However, an FPGA may lack sufficient analog resources, and so a separate analog chip, such as for providing digital-to-analog conversions, may be used. However, for purposes of clarity by way of example and not limitation, it shall be assumed that FPGA 819 has a sufficient number of ADCs 817 for converting analog signals 806-1 through 806-N into corresponding digital data outputs 805-1 through 805-N. FPGA 819 may include a digital interface 859 for outputting digital data outputs 805-1 through 805-N. Optionally, FPGA 819 may be configured with a control signal generator circuit to generate and output a control signal 811.

In this example, FOVC 810M includes a DAQ 820 having an FPGA 819 configured for inputs 1 through N of an analog input interface 852 ("inputs 852") and outputs 1 through 2N of an analog output interface 856 ("outputs 856"), for example separate analog output ports. Inputs 852 may correspond to a group of signals 806-1 through 806-N. Pairs of outputs 808-1 through 808-N of outputs 302 may respectively be provided to laser controllers 853-1 through 853-N. Laser controllers 853-1 through 853-N may provide respective pairs of TEC and current control signals 885-1, 816-1 through 885-N, 816-N to DFBs 882-1 through 882-N, respectively.

For purposes of clarity by way of example and not limitation, laser controllers 853-1 through 853-N are illustratively depicted as including corresponding pairs of current and TEC controllers, which were illustratively depicted as separate controllers 816 and 885, respectively, in FIG. 10-1 for purposes of clarity. However, it should be understood that controllers 885 and 816 may be incorporated into a laser controller 853.

For purposes of scaling an FOVC 810, it should be appreciated that a single FPGA 819 may be used by a DAQ 820 configured to support N channels. In this example, FOVC 810M does not include optical circulators 883-1 through 883-N; however, in another configuration, FOVC 810M may include optical circulators 883-1 through 883-N.

Generally, FPGA 819 generates respective sets, such as pairs for example, of TEC and current control signals 808-1 through 808-N via analog output ports 856 of DAQ 820, and such respective sets of TEC and current control signals 808-1 through 808-N may be used to provide corresponding pairs of TEC control and current control signals 885-1, 816-1 through 885-N, 816-N to respectively lock DFB lasers 882-1 through 882-N to their respective FBG sensors 111-1 through 111-N by adding respective error signals. Such respective error signals may be generated from FPGA 819 generated PID control to provide current and TEC set points via digital summing as previously described herein, though on a per-channel basis in this example of FOVC 810M. For long distance measurements, N fiber extenders, whether all transmission fiber extenders, all reflection fiber extenders, or a combination thereof may be used in conjunction with multichannel FOVC 810M.

Figure 11:
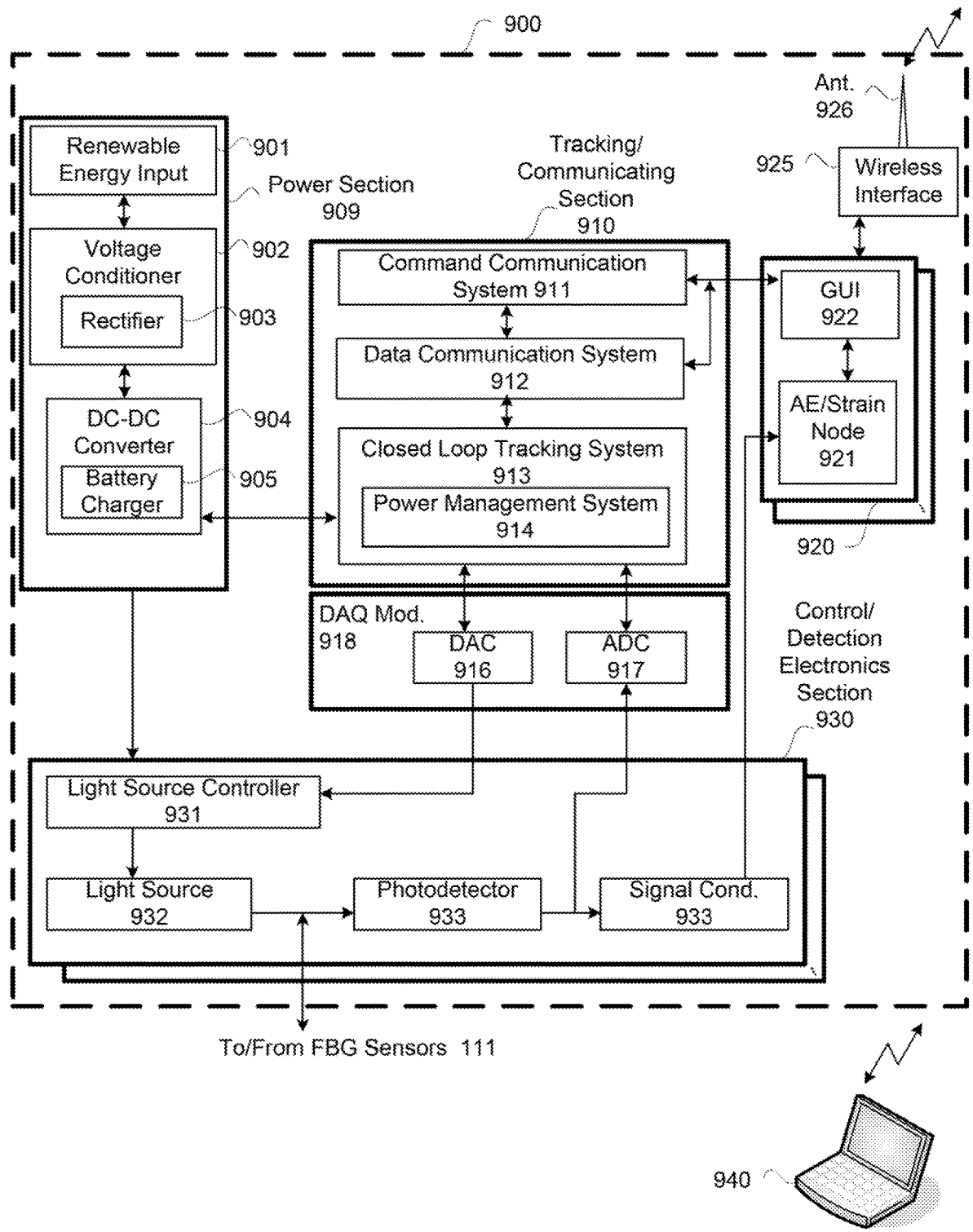
FIG. 11 is a block diagram depicting an exemplary self-powered control/detection system.

FIG. 11 is a block diagram depicting an exemplary self-powered control/detection system 900. Control/detection system 900 follows from the above description of FOVC 810M, and thus is not described in unnecessary detail to avoid repetition.

Control/detection system 900 may be coupled to FBG sensors 111 by fiber optic lines to control/detection electronics section 930. Control/detection electronics section 930 may include a light source controller 931, a light source 932, a photo detector 933, and a signal conditioner 933. An analog output from DAC 916 may be provided to light source controller 931. Light source controller 931 may be coupled to light source 932 for control thereof responsive to such analog output.

Light output from light source 932 may be provided to FBG sensors 111 for providing an optical input to photodetector 933. Output of photodetector 933 may be provided to ADC 917 and to signal conditioner 933. Signal conditioner 933 may be for AE.

In this example, a single control/detection electronics section 930 is illustratively depicted. However, in other examples, more than one control/detection electronics section 930 may be present.

Output of signal conditioner 933 may be provided as an input to AE/strain node 921 of a conventional AE/strain system 920. A graphical user interface ("GUI") 922, such as in Java for example, may be used to communicate with AE/strain node 921. AE/strain node 921 may be a IEEE 1284 compliant node.

AE/strain system 920 may be coupled to a wireless interface 925, such as for a ZigBee protocol for example, for wireless communication via antenna 926. For example, a notebook computer 940 may be used to communicate with wireless interface 925.

DAC 916 and ADC 917 may be of a data acquisition module or DAQ 918. DAC 916 and ADC 917 may be coupled to a closed loop tracking system 913 of a tracking communication section 910. Tracking communication section 910 may be implemented with an FPGA for example.

Closed loop tracking system 913 may include a power management system 914. Power management system 914 may be coupled to a power section 909.

Power section 909 may include a renewable energy input source 901, such as solar, wind, and/or other an energy harvester for example, a voltage conditioner 902, and a DC-DC converter 904. Renewable energy from renewable energy input source 901 may be provided to voltage conditioner 902 for conditioning. Voltage conditioner 902 may include a rectifier 903, such as a full bridge rectifier for example, to rectify input voltage for such conditioning.

Conditioned voltage output by voltage conditioner 902 may be input to a DC-DC converter 904 for conversion to a desired DC voltage level from a DC input voltage. DC-DC converter 904 may include a battery charger 905 to charge a battery or other storage device.

Output DC voltage from DC-DC converter 904 may be provided to a closed-loop tracking system 913, such as previously described herein. Closed-loop tracking system 913 may include a power management system 914 for managing power.

Data may be communicated between DAC 916 and ADC 917 and closed-loop tracking system 913, as previously described herein. Moreover, data may be communicated between data communication system 912 and closed-loop tracking system 913 both of which may be of tracking/communication section 910. Data may be communicated between command communication system 911 and data communication system 912 both of which may be of tracking/communication section 910. Again, as examples of such systems have been previously described, such description is not repeated for purposes of clarity and not limitation.

Data, including without limitation command information, may be communicated between systems 911 and/or 912 and a graphical user interface ("GUI") 922. GUI 922 may be in communication with an AE/strain node 921 both of which may be of AE/strain system 920.

AE/strain system 920 may be coupled to wireless interface 925, which may be configured for a ZigBee protocol for example, for wireless communication via one or more antennas 926. Along those lines, a notebook computer 940 may be used for communication with control/detection system 900 via wireless interface 925. Notebook computer 940 may be a conventional notebook PC or other computing device, and such computing device may be programmed with special-purpose software for control/detection system 900.

In an example, power electronics design of control/detection system 900 may be based on the MB39C811 chip from Spansion, Inc. This chip is specialized in harvesting vibration energy. Piezo patches harvest mechanical vibration energy into electrical energy originally in AC which may be converted into DC. To enhance harvesting energy, a voltage conditioner may double any low AC voltage before being rectified by a high efficient bridge rectifier and filtered into DC power.

In this example, a DC-DC converter may convert raw DC power depending on vibration source into a stable 5V supply to all electronics. Smart battery charging circuitry under micro-computer control may charge a battery for backup when vibration energy sources cease.

A BM39C811 device could provide a load of 100 mA at 5V with the efficiency up to 90% for a large range of input voltage from 8V to 20V harvested from vibration energy. For AE wireless monitoring, a Mistras Group's commercially available 1284 AE wireless node may be used. This node contains multiple sensing elements, on-board signal processing elements, signal conditioning electronics, power management circuitry, a wireless data transmission element and is capable of using an energy harvesting unit. For this device, the main sensing elements are acoustic emission sensors; however, several parametric inputs are provided to connect to different sensors such as strain gage, thermometer, and pH meter. The output of all these sensors may be combined and analyzed at a sensor node in order to reduce a data transmission rate and consequently reduce power consumption.

For this example, the total power may be as low as 18 Watts for the entire instrument when in full operation. Total power consumption can be significantly reduced to below 10 Watts by operating at 50% laser power and by designing sensor wavelengths under nominal load to overlap with laser wavelength at room temperature, minimizing laser thermal compensation provided by a thermos-electric cooling system. In a standard operation mode, a microcontroller ("MCU") can be preprogrammed to initiate a data collection process at a fixed frequency and duration. For example, an internal timer of an MCU can turn on sensors for a few seconds per hour during a load measurement mode. For power transformer monitoring applications when energy harvesting is desirable, a UBI-2590 lithium ion rechargeable battery can be used, which can provide up to a 12 A-hr at 14.4V, equivalent to 173 W-hrs DC. Using such a battery, this example FOAE instrument may last for up to 20 hours without energy harvesting. For more extended operation, shorter acquisition times can be used. For example, if a data acquisition interval is 1 second per hour or less, this example FOAE instrument can last more than one year without recharging the battery.

For example, a compact four channel wireless AE detection system including a FBG sensor array, four miniaturized laser controllers, four photodiodes, a 4-channel DSP-based data acquisition system combined with a four-channel wireless AE node may be implemented. An example 4-channel FOAE system may include: (1) a power conditioner section for EMI filtering, conditioning and managing the system power from the energy harvesting unit or from a battery, (2) a control/detection electronics section including 4 DFB laser controllers, 4 detector boards, and AE and strain signal conditioner circuits, (3) a tracking data acquisition section including a 4-channel digital DSP/FPGA-based data acquisition board, and (4) an AE/strain data acquisition system including a commercial PAC 1284 wireless AE/strain wireless node ("1284 node"). For this example, an analog laser controller/photodetector board may include lasers and control electronics, InGaAs photodiodes and preamplifier circuits, and signal conditioning electronics which provides both high-frequency AE signals and low frequency strain signals to a 1284 node. In such a DSP/FPGA board, a DSP provides closed loop computation for tracking while an FPGA performs communication management among channels and to the outside world. Such an FPGA may deliver calculated analysis results from such a DSP in a digital format to control wavelength of individual laser sources, such as laser diodes, via two DACs, one for laser wavelength tracking and the other for laser optical power. For AE and strain data acquisition, a 1284 node may accept high bandwidth AE analog signals (10-250 kHz) from a detector amplifier and low frequency strain signals (DC to 5 kHz) from voltage conditioned laser control signals. A summary of AE features and real-time strain signals may be transmitted wirelessly to a nearby laptop via a WLAN transceiver, and such data may be plotted in real-time. Both raw AE waveform and strain data may be stored locally in such a 1284 node, such as using a SD memory card.

Supervised Wavelength Tracking

Figure 12:
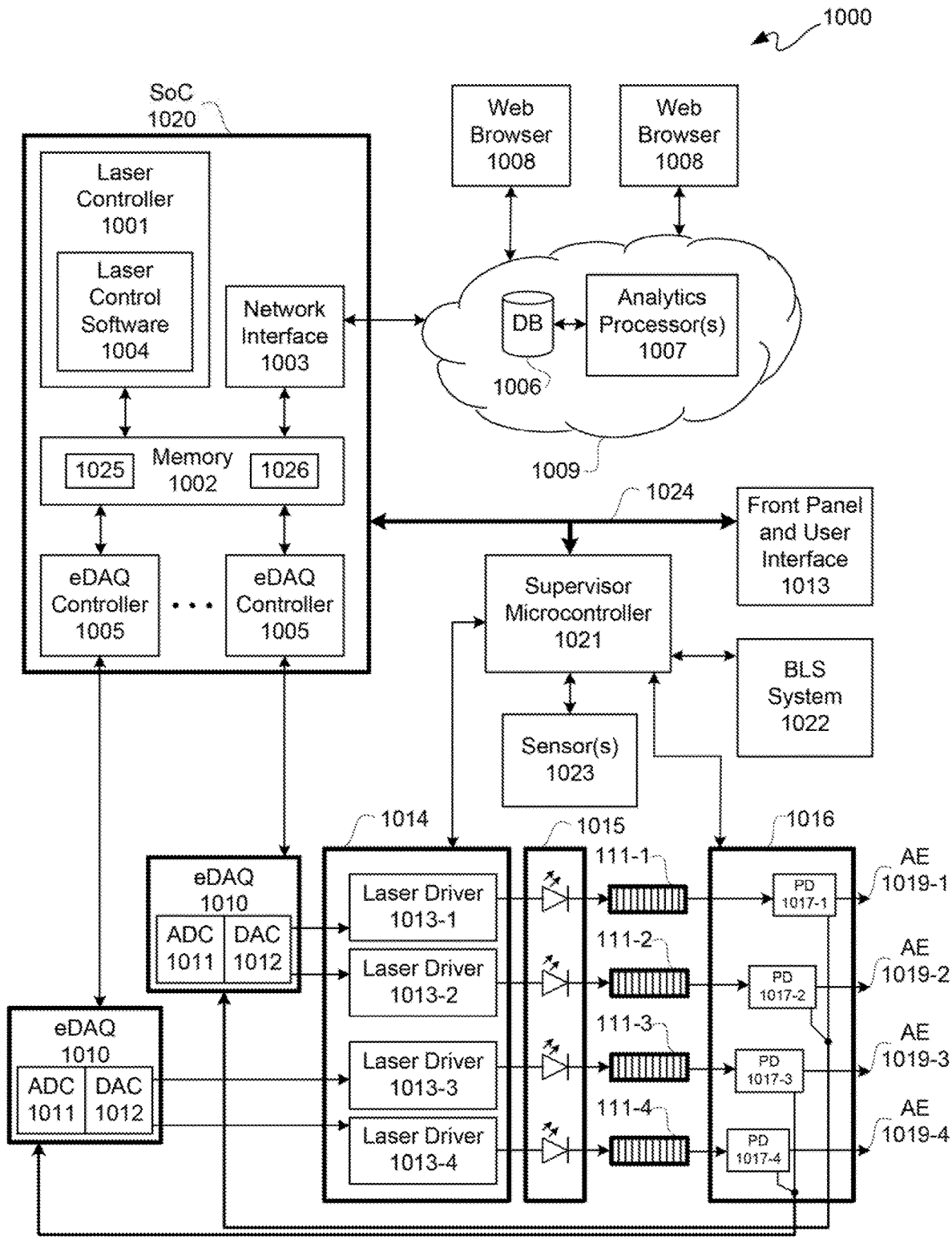
FIG. 12 is a block diagram depicting an exemplary wavelength tracking system using fiber optic voltage conditioning for AE sensing.

FIG. 12 is a block diagram depicting an exemplary wavelength tracking system 1000 using fiber optic voltage conditioning, as described above, for sensing AE. Wavelength tracking system 1000 uses a broadband light source system ("BLS system") 1022, such as previously described for measuring microstrain. BLS system 1022 provides a monitoring subsystem for wavelength tracking system 1000 to provide an initial FBG position for FOAE tracking recovery. Along those lines, BLS system 1022 may have multiple wavelengths within a BLS. For example, each color in broadband light from a broadband light source represents a different wavelength. Wavelength multiplexing may be used to feed information to a controller 1021. Controller 1021 may be implemented to include a finite state machine ("FSM"). In an example implementation, controller 1021 may be implemented with a microcontroller. For purposes of clarity by way of example and not limitation, controller 1021 shall be assumed to be a microcontroller 1021. Microcontroller 1021 may be a trusted "supervisor microcontroller", and microcontroller 1021 may be used to prompt BLS system 1022 to feed information for a particular wavelength for tracking recovery.

One or more lasers may be used with BLS system 1022 for dynamic configuration or reconfiguration. In order to provide voltage conditioning for acoustic emissions ("AE") measurements, an open/closed loop control system may be used to actively track a wavelength of a narrowband tunable light source, such as a distributed feedback ("DFB") laser, to a Bragg wavelength of a fiber Bragg grating ("FBG") sensor. A wavelength tracking-based fiber optic acoustic emission voltage conditioner ("FOVC") may be used to convert an optical signal from FBG sensors to an AC voltage output that can directly interface with conventional AE instrumentation. The signal output of such an FOVC resembles that of a piezo-electric sensor used in convention AE measurements, facilitating sensor "drop in replacement".

However, AE with laser tracking is sensitive, and thus more likely to lose tracking. To quickly recover tracking or moving to another wavelength, a laser may be tuned to lock to a different FBG wavelength of one of FBG sensors 111. For example, if there is a "hot spot" indicated by microstrain measurements obtained from BLS system 1022, one or more lasers may be directed to such "hot spot" using dynamic reconfiguration by dynamically retuning such one or more lasers to lock to one or more corresponding different FBG wavelengths. For example, when a rosette principal direction drifts from a nominal value indicating presence of damage, one or more lasers may be tuned to one or more FBG wavelengths associated with such rosette. Independently or in addition to retuning for microstrain detected damage, one or more lasers of an AE data acquisition system may be locked to one or more FBG wavelengths for a "wake up" mode and/or when a load exceeds a load threshold.

Different wavelengths may be in a rosette including different FBG wavelengths. Moreover, a BLS light may share a fiber with a laser source light, where a BLS and a laser use same or different wavelengths, as a laser source can overwhelm a BLS source. Furthermore, with different FBG wavelengths, lasers may share a same fiber.

Wavelength tracking system 1000 includes a SoC 1020, which optionally may be used for edge computing. SoC 1020, such as may be an FPGA with one or more FPGA-based microprocessors, which may be coupled to a cloud-based computing system 1009 through a network interface 1003 of such SoC 1020. Such a cloud-based computing system 1009 may include data storage 1006, such as may include database ("DB") software, and one or more processors 1007 configured with analytics software, such as SaaS for example, for processing raw and feature extracted data obtained from SoC 1020. Optionally, such SoC 1020 may be configured for local processing of raw data, such as for extraction of information from such raw data, in an optional FPGA-based edge computing configuration. Along those lines, SoC 1020 may send results and/or information obtained from local processing of raw data, rather than, or optionally in addition to, sending raw data in order to conserve bandwidth and/or enhance overall processing capacity. One or more web browser computers or other web-configured devices 1008 may be put in communication with cloud-based computing system 1009 for accessing stored data, whether raw and/or processed data.

SoC 1020, in addition to network interface 1003, may include a laser controller 1001, memory 1002, and one or more electronic data acquisition ("eDAQ") controllers, such as eDAQ controllers 1005 for example. Laser controller 1001 may be configured with laser control software 1004.

Laser controller 1001 and network interface 1003 may be coupled through and share memory 1002. Additionally, eDAQ controllers 1005 may be coupled to and share memory 1002. While two eDAQ controllers 1005 are illustratively depicted, in another example fewer or more than two eDAQ controllers 1005 may be used.

A supervisor microcontroller 1021 may be coupled through bus 1024 to SoC 1020 for communication therewith. However, in another implementation, supervisor microcontroller 1021 may be incorporated into SoC 1020. Memory 1002 may be configured with a look-up table 1025. Look-up table 1025 may include predetermined settings for different FBG wavelengths for one or more eDAQ controllers 1005, eDAQ converters 1010, laser drivers 1013, photodetectors 1017, and/or other components of wavelength tracking system 1000. Such settings in lookup table 10125 may be used for tuning one or more modules of wavelength tracking system 1000 for optimum performance for a variety of applications.

To provide supervised wavelength tracking, a multichannel sensor interrogation array may be used. Different and/or same types of logistics sensors 1023, such as a GPS sensor, an accelerometer sensor, and/or a liquid monitoring sensor, among other types of sensors, may be used for logistics for an AE sensing application. Additionally or optionally, logistics sensors 1023 may include one or more controllers for pulse generators. Such one or more controllers for pulse generators may be configured to generate predefined periodic pulses of stress waves for individual automated sensor testing ("AST"). These stress waves may be used to provide acousto-ultrasonic testing to capture a principal strain and a principal direction of each sensor rosette using pitch catch and/or pulse-echo processing. Along those lines, for example a piezo-electric actuator may be placed remotely from or proximate to supervisor microcontroller 1021, and a controller for pulse generation may be in wireless communication with such an actuator for causing such actuator to pulse for propagation of such pulse along a monitored structure. Such a controller for pulse generation and/or other logistics sensors 1023 may be coupled to supervisor microcontroller 1021 for obtaining different sensing inputs associated with logistics, multi-sensing data collection and/or sensor fusion analytics, which may include one or more of finite state machine states including wake-up call triggering, system initialization, wavelength tuning, tracking control, wavelength monitoring, tracking recovery, system shutdown, and dynamic re-configuration for on-demand new sensor selection.

A BLS system 1022 may be coupled to supervisor microcontroller 1021 for providing wavelength tracking. A front panel and user interface 1013 may be coupled through bus 1024 to SoC 1020 and supervisor microcontroller 1024 for unlocking those components, if locked. Along those lines, SoC 1020 and supervisor microcontroller 1024 may be protected with boot protection, which may be hardware and/or software based protection. Additionally, front panel and user interface 1013 may be coupled through bus 1024 to SoC 1020 and supervisor microcontroller 1024 for initializing and monitoring status of those components.

In a trusted mode of operation, a trusted supervisor microcontroller 1024 may be responsible for unlocking and initializing hardware sub-modules. With a trusted boot of supervisor microcontroller 1024, SoC 1020, an array of laser drivers 1014, and an array of photodetectors ("PDs") 1016 may be unlocked and initialized under control of supervisor microcontroller 1024. A locked state may be present at power-up or reset of wavelength tracking system 1000. A look-up table 1026 in memory 1002, or in memory of microcontroller 1024 in another implementation, may be preloaded with specific information to prohibit functioning of wavelength tracking system 1000 responsive to a failure of authentication of one or more module components of such system. In other words, authentication may be performed at initialization to validate a system configuration of wavelength tracking system 1000.

Additionally, supervisor microcontroller 1024 may be configured to monitor system statistics of wavelength tracking system 1000 to ensure proper operation, such as operation within predefined parameters for example. If a module or other portion of wavelength tracking system 1000 is not operating within predefined parameters, supervisor microcontroller 1024 may halt or shut down such module or other portion not operating within predefined parameters.

Supervisor microcontroller 1024 may additionally provide "black box" functionality by allowing an external device to view logged events, which may be periodically logged by supervisor microcontroller 1024. Such an event log may be used to view a state of wavelength tracking system 1000, including an ability to determine for example whether an anomalous event has occurred. Supervisor microcontroller 1024 may communicate with front panel and user interface 103 to illuminate status LEDs or other devices used to communicate status to allow a user to have up-to-date information about operation of wavelength tracking system 1000.

Supervisor microcontroller 1024 may be used to offload system management tasks from SoC 1020 from real-time control processes running on SoC 1024, which in this example is implemented with an FPGA. These real-time control processes may be used for controlling eDAQ converters 1010.

Crack growth and/or damage hot spot monitoring using an FBG rosette may be used to distinguish between damage and its effect on principal strain direction and/or changes in loading by comparing with neighboring rosettes. Principal strain direction at one or more FBG rosettes may shift in the presence of a local crack for example, while one or more nearest neighbor FBG rosettes may not indicate any change. Thus, one or more FBG rosettes touching or proximate to such local damage may be used to indicate damage.

Along those lines, in an example for a local crack or other detectable damage, the principal direction of a rosette touching or proximate to a crack may show change independent of temperature, geometry or any other background change. In addition to being independent of environmental conditions, a nearest neighbor damage index may be baseline free, which may be useful in applications with more or less arbitrary loading conditions. In other words, no pristine or other background information need be used, such as measured and subtracted out, because local information may be directly compared to global information. In other words, one or more rosettes local to a damage site may be directly compared to one or more nearest neighbors absent a baseline. Such a direct comparison may be used to avoid false positives, as comparison with nearest neighbor rosettes may be used to indicated damage without being confounded by load direction and/or load magnitude. Any change in load direction may change principal strain vectors at all rosettes in an array; however, with nearest neighbor comparisons, local damage may only change the principal strain vector at such local location.

For a nearest neighbor comparison, damage severity may be quantified by using a normalized damage index ("DI") formula as follows:

$$DI = \sin\left|\theta_i - \frac{1}{n}\sum_{k=1}^{n}\theta_k\right|$$

where i is a rosette immediately at or adjacent to a damage instance, such as a crack for example, and k are one or more nearest neighbor rosettes. The larger the difference between i and k may indicated a larger amount of damage.

For a grid or array of rosettes, both near field and far field effects of loading may be detected. A damage index value for DI may range from 0 to 1, inclusive, with 0 being no crack and with 1 being for a rosette directly on a crack. Along those lines, a DI value may be compared or otherwise processed against other DI values of other rosettes in a grid to identify a damage region, or at least a probability of a damage region relative to such DI value. However, as indicated above, a baseline-free DI value is an absolute value for an FBG, and not a relative value as compared to some existing DI-based damage detection techniques that requires knowledge of the pristine condition as a baseline reference for background subtraction. This means that a baseline-free DI value obtained from a local discontinuity in a principal direction compared to one or more of its nearest neighbors may generally be insensitive to changes in a local environment, boundary conditions, loading conditions, and may be used to indicate a "permanent" shift in a principal direction due to damage.

Moreover, rosettes may be used to provide damage imaging for real-time visualization and/or post damage evaluation. Rosettes may be placed on interior and/or exterior surfaces of a structure to form a two-dimensional and/or three-dimensional image. Rosettes may be provided in a single layer or multiple layers.

eDAQ controllers 1005 may respectively control eDAQ converters 1010. While two eDAQ converters are illustratively depicted, in another implementation more or fewer eDAQ converts 1010 may be used. Each eDAQ converter 1010 may include an ADC 1011 and a DAC 1012.

eDAQ converters 1010 may be used for providing analog signals to laser drivers 1013. In this example, there are laser drivers 1013-1 and 1013-2 fed by one eDAQ converter 1010, and there are laser drivers 1013-3 and 1013-4 fed by another eDAQ converter 1010. Laser drivers 1013 may be set to different FBG wavelengths. So in this example, four different wavelengths for laser light outputs may be used with analog information from two eDAQ converters 1010.

Outputs from laser drivers 1013 may be provided to respective optical LEDs of an array of LEDs 1015. Outputs from LEDs 1015 may respectively be input to FBG fiber-optic sensors 111-1 through 111-4, with each FBG fiber-optic sensor 111 in a rosette or rosette-like pattern. Outputs for FBG fiber-optic sensors 111-1 through 111-4 may be respectively input to photodiodes 1017-1 through 1017-4 of an array of photodiodes 1016. Output of each of photodiodes 1017-1 through 1017-4 is corresponding AE information 1019-1 through 1019-4. AE information 1019-1 and 1019-2 may be fed back to a corresponding source eDAQ converter 1010, and AE information 1019-3 and 1019-4 may be fed back to another corresponding source eDAQ converter 1010.

Because BLS may be more easily tracked than laser light and may consume less power, BLS system 1022 may be used as an initial interrogator of FBG fiber-optic sensors 111, which may be shared with lasers 1013 (though not shown in this FIG. 12 for purposes of clarity and not limitation). If such interrogation results in detection of damage by microstrain information and/or one or more DIs for corresponding FBG fiber-optic sensors 111, lasers 1013 may be used to obtain more precise AE information 1019. SoC 1020 may be coupled to receive an output signal from BLS system 1022 and configured to clean up such output signal, detect peaks in such output signal, and quantify power associated with one or more peaks detected in such output signal. This information from such an output signal may be used by SoC 1020, as SoC may be configured to quantify wavelength shifts in such output signal as being directly proportional to amounts of strain and spectral power sensed by fiber-optic sensors in a rosette or rosette-like pattern. These wavelength shifts may be used to provide one or more wavelength adjustment information for one or more wavelength adjustments to shift one or more laser drivers to corresponding FBG wavelengths of FBG sensors 111 associated with such output indicating a damage area. Such FBG sensors 111, and thus fiber-optic lines associated therewith, may be shared as between lasers and a BLS, as previously described.

In another implementation, such output signal from BLS system 1022 may be combined with information output from one or more logistics sensors 1023, such as by supervisor microcontroller 1021, for providing to SoC 1020, and optionally subsequently to cloud-based computing system 1009, for analysis by either or both SoC 1020 or analytics processors 1007. Analysis results from cloud-based processing at cloud-based computing system 1009 may be communicated to SoC 1020. Such analysis results from either or both SoC 1020 or analytics processors 1007 may be used to identify which one or more FBG sensors 111 to target to obtain AE information 1019 and to shift one or more wavelengths for one or more laser drivers 1013, as previously described, associated with such identified FBG sensors 111. Again, for example, this shift may be for obtaining AE information 1019 for an identified hot spot.

Figure 13:
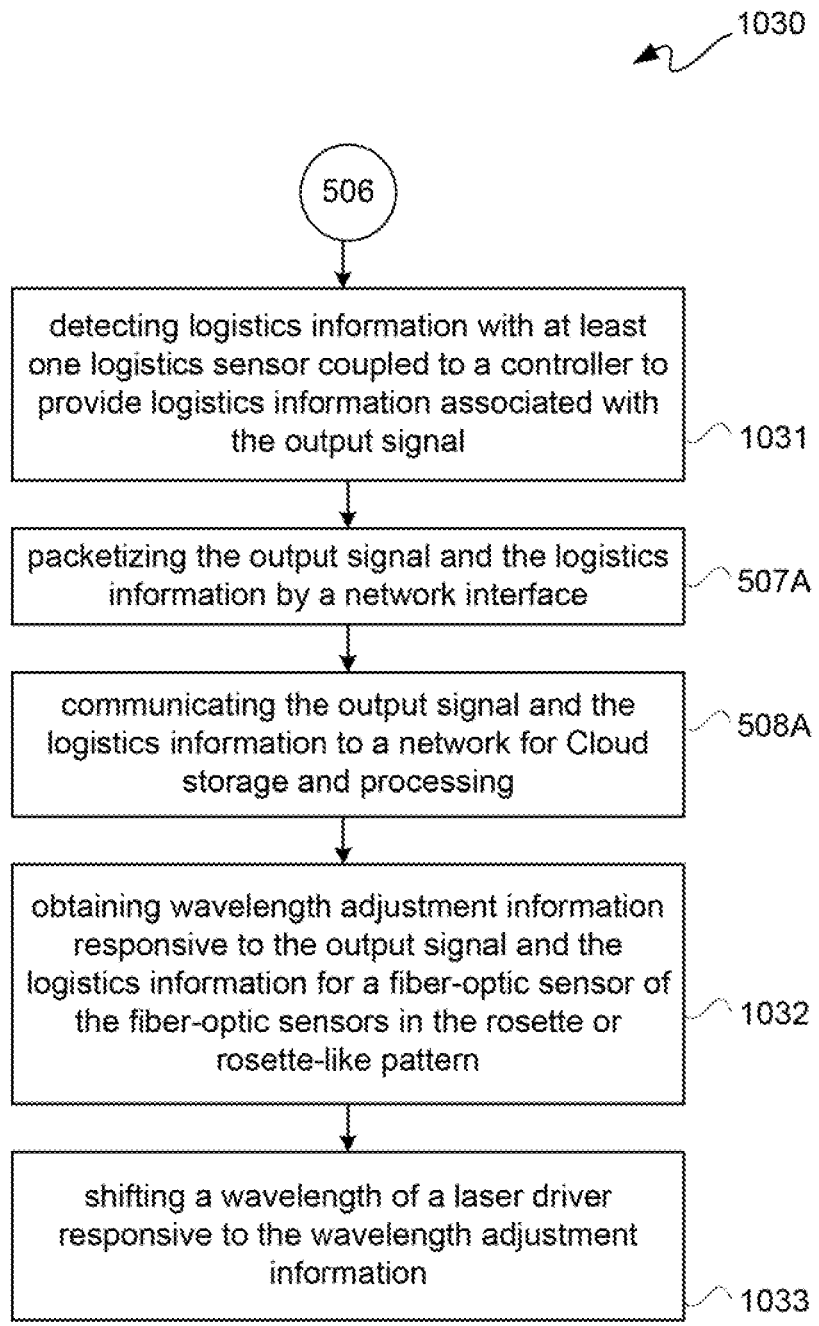
FIG. 13 is a flow diagram depicting an exemplary wavelength tracking flow.

With renewed reference to FIG. 5, continuing reference to FIG. 12, and additional reference to a flow diagram of FIG. 13 depicting an exemplary wavelength tracking flow 1030, wavelength tracking flow 1030 is further described.

At 1031, logistics information may be detected with at least one logistics sensor 1023 coupled to a controller 1021 to provide logistics information associated with an output signal obtained at 506 from a BLS system 1022. Such output signal obtained at 506 may be provided to SoC 1020 for local and/or cloud-based processing. For purposes of clarity by way of example and not limitation, it shall be assumed that cloud-based processing is used, though in other implementations local processing with an SoC 1020, a locally wirelessly or wired coupled computer, and/or cloud-based processing may be used.

At operation 507A, such output signal and associated logistics information may be packetized by a network interface 201 of SoC 1020. At operation 508A, such output signal and associated logistics information may be communicated, via hardwire or over-the-air wireless connection, to a network for Cloud storage and processing, as previously described.

In an implementation, using a low-power SHM with FBG rosettes to monitor, including without limitation to continuously monitor, for damage precursors, such as for example principal strain direction changes, a higher power AE sensor interrogation may be activated responsive to detection of strain from such monitoring. As previously described, low-power SHM using FBG rosettes may be used to continuously monitor for changes in a host structure's principal strain direction. Detection of strain by such a FOS system 100 or 200 may suggest damage. Along those lines, detection of strain by an FOS system 100 or 200 may be used to automatically trigger a higher power AE sensor to provide for better characterization of such suspected damage. Additionally, damage may cause a shift in an FBG wavelength of an FBG sensor, and so wavelength tracking off of a BLS may be used in addition to selective activation of AE sensor interrogation.

At 508A analytic processing of an output signal and associated logistics information may be performed by a cloud-based computing system 1009 to obtain at analytics results, which may include wavelength adjustment information. At 1032, such wavelength adjustment information may be communicated, such as from cloud-based computing system 1009, to be obtained by SoC 1020. Such wavelength adjustment information may be responsive to such an output signal and associated logistics information for a fiber-optic sensor 111 of fiber-optic sensors in a rosette or rosette-like pattern. At 1033, a wavelength of a laser light source, such as a laser driver 1013, may be shifted responsive to such wavelength adjustment information.

Figure 14:
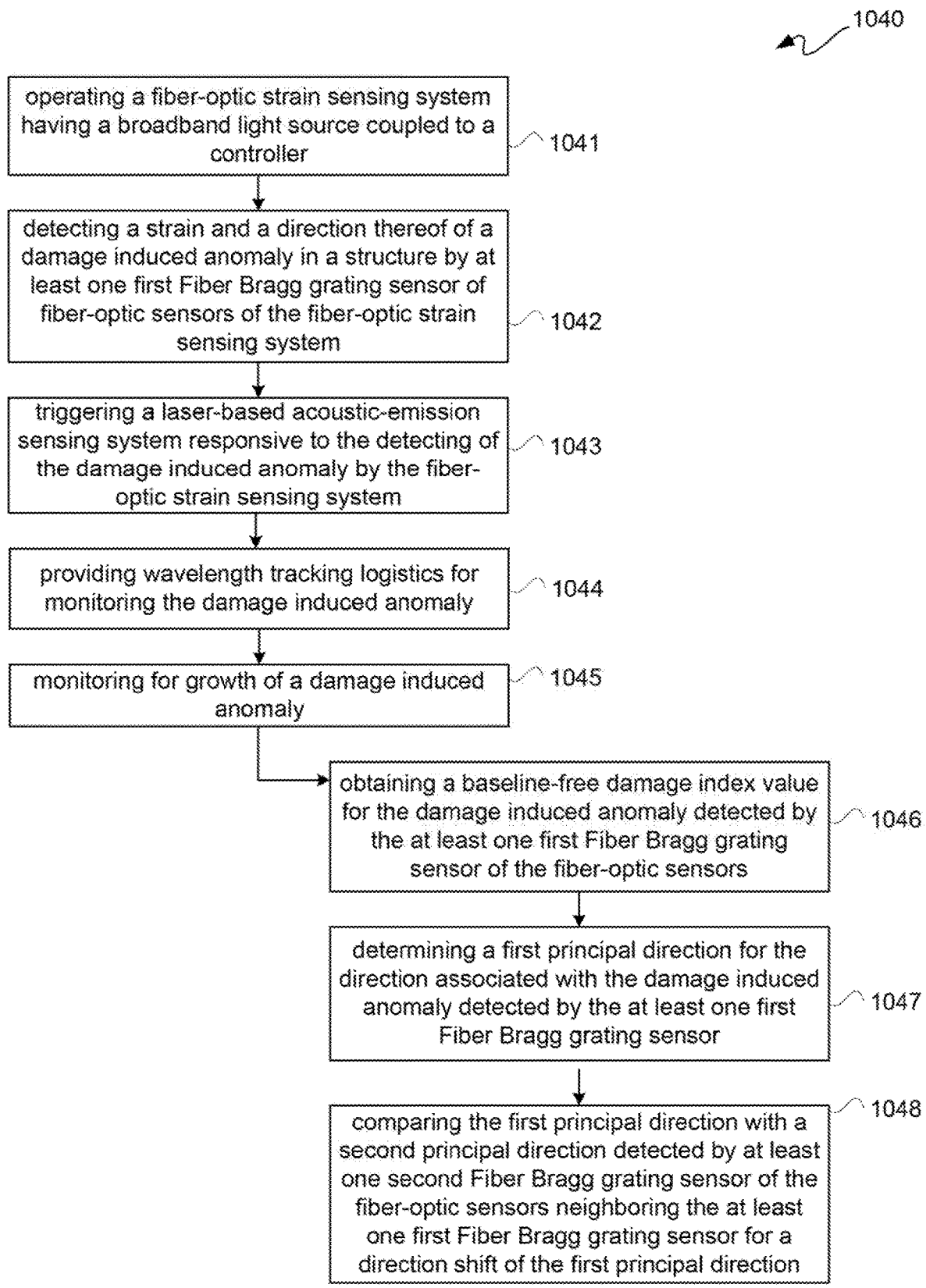
FIG. 14 is a flow diagram depicting an exemplary damage induced anomaly detecting and monitoring flow for a multi-sensing system.

FIG. 14 is a flow diagram depicting an exemplary damage induced anomaly detecting and monitoring flow 1040 for a multi-sensing system, such as previously described. Such a multi-sensing system may be power efficient by a broadband light source strain sensing system for triggering use of a laser-based acoustic emission sensing system, as previously described, where the former system is low power as compared with use of the latter system. Damage induced anomaly detecting and monitoring flow 1040 is further described with simultaneous reference to FIGS. 1 through 14.

At 1041, a fiber-optic strain sensing system having a broadband light source coupled to a controller may be operated, such as previously described for example. At 1042, a strain and a direction thereof of a damage induced anomaly in a structure may be detected by at least one first Fiber Bragg grating sensor of fiber-optic sensors of the fiber-optic strain sensing system. Such strain and direction thereof may be a principal strain and a principal direction thereof, respectively.

At 1043, a laser-based acoustic-emission sensing system may be activated or otherwise triggered responsive to the detecting of a damage induced anomaly by a fiber-optic strain sensing system, such as previously described. At 1044, wavelength tracking logistics for monitoring such a damage induced anomaly may be provided. Such wavelength logistics may include use of an FSM implemented with a microcontroller, such as previously described. Along those lines, a supervisor microcontroller may be used to provide or supervise provisioning of one or more forms of wavelength tracking logistics. Such wavelength tracking logistics, including without limitation finite states, may include one or more of the following for a of a laser-based system: wake-up call triggering, system initializing, wavelength tuning, controlled wavelength tracking, wavelength monitoring, wavelength recovery, system shut-down, or dynamic reconfiguration for on-demand sensor selection including without limitation changing as between sensors.

At 1045, growth of a damage induced anomaly may be monitored. This monitoring may include using wavelength tracking logistics provided at 1044. However, more particularly, such monitoring may include operations at 1046 through 1048.

At 1046, obtained may be a baseline-free damage index value for a damage induced anomaly detected by at least one first Fiber Bragg grating sensor of fiber-optic sensors, such as previously described herein. At 1047, a first principal direction for a direction associated with such damage induced anomaly detected by such at least one first Fiber Bragg grating sensor may be determined. At 1048, such first principal direction may be compared with a second principal direction detected by at least one second Fiber Bragg grating sensor of such fiber-optic sensors, which may be a nearest neighbor or other neighbor of such the at least one first Fiber Bragg grating sensor, for a direction shift of such first principal direction.

While the foregoing describes exemplary apparatus(es) and/or method(s), other and further examples in accordance with the one or more aspects described herein may be devised without departing from the scope hereof, which is determined by the claims that follow and equivalents thereof. Claims listing steps do not imply any order of the steps. Trademarks are the property of their respective owners.

What is claimed is:

1. A method for a multi-sensing system, comprising:
   operating a fiber-optic strain sensing system having a broadband light source coupled to a controller;
   detecting a strain and a direction thereof of a damage induced anomaly in a structure by at least one first Fiber Bragg grating sensor of fiber-optic sensors of the fiber-optic strain sensing system;
   wherein the strain and the direction thereof is a principal strain and a principal direction, respectively, for the damage induced anomaly;
   triggering a laser-based acoustic-emission sensing system responsive to the detecting of the damage induced anomaly by the fiber-optic strain sensing system; and
   providing wavelength tracking logistics for monitoring the damage induced anomaly.

2. The method according to claim 1, wherein the wavelength tracking logistics are provided by one or more of wake-up call triggering, wavelength tuning, feedback-controlled wavelength tracking, wavelength recovery tracking, or dynamic sensor selecting.

3. The method according to claim 1, further comprising the monitoring of the damage induced anomaly for growth, the monitoring comprising:
   obtaining a baseline-free damage index value for the damage induced anomaly detected by the at least one first Fiber Bragg grating sensor of the fiber-optic sensors;
   determining a first principal direction for the principal direction associated with the damage induced anomaly detected by the at least one first Fiber Bragg grating sensor; and
   comparing the first principal direction with a second principal direction detected by at least one second Fiber Bragg grating sensor of the fiber-optic sensors neighboring the at least one first Fiber Bragg grating sensor for a direction shift of the first principal direction.

4. The method according to claim 1, wherein the detecting comprises:
   having the fiber-optic sensors of separate optical fibers in a rosette or rosette-like pattern; and
   generating a light signal with the broadband light source of a Fiber Bragg Grating analyzer for having Fiber Bragg Grating wavelengths in the rosette or rosette-like pattern in parallel.

5. The method according to claim 4, wherein the detecting further comprises:
   receiving the light signal by an optical circulator of the Fiber Bragg Grating analyzer;
   providing the light signal from the optical circulator to the fiber-optic sensors;
   receiving a returned optical signal from the fiber-optic sensors by the optical circulator; and
   providing the returned optical signal from the optical circulator to a spectral engine of the Fiber Bragg Grating analyzer to provide an output signal.

6. The method according to claim 5, further comprising:
   preprocessing raw data at an edge node having the broadband light source to provide the output signal;
   packetizing the output signal by a network interface; and
   communicating the output signal to a network for storage and analytics processing.

7. The method according to claim 5, further comprising:
   detecting logistics information with at least one logistics sensor coupled to a controller to provide logistics information associated with the output signal;
   obtaining wavelength adjustment information responsive to the output signal and the logistics information for at least one fiber-optic sensor of the fiber-optic sensors in the rosette or rosette-like pattern; and
   shifting a wavelength of a laser light source responsive to the wavelength adjustment information.

8. The method according to claim 5, wherein the returned optical signal comprises peaks associated with plane strain obtained by at least one first Fiber Bragg grating sensor of the fiber-optic sensors having either a directionally normal x-axis position or a directionally normal y-axis position and by a second Fiber Bragg grating sensor of the fiber-optic sensors having an x-y position respectively of different ones of the optical fibers.

* * * * *